United States Patent
Hongo et al.

(10) Patent No.: US 7,129,124 B2
(45) Date of Patent: Oct. 31, 2006

(54) DISPLAY DEVICE, PROCESS OF FABRICATING SAME, AND APPARATUS FOR FABRICATING SAME

(75) Inventors: Mikio Hongo, Yokohama (JP); Sachio Uto, Yokohama (JP); Mineo Nomoto, Yokohama (JP); Toshihiko Nakata, Hiratsuka (JP); Mutsuko Hatano, Kokubunji (JP); Shinya Yamaguchi, Mitaka (JP); Makoto Ohkura, Fuchu (JP)

(73) Assignee: Hitachi Displays, Ltd., Hayano Mobara (JP)

( * ) Notice: Subject to any disclaimer, the term of this patent is extended or adjusted under 35 U.S.C. 154(b) by 362 days.

(21) Appl. No.: 10/628,421

(22) Filed: Jul. 29, 2003

(65) Prior Publication Data

US 2004/0041158 A1    Mar. 4, 2004

(30) Foreign Application Priority Data

Sep. 2, 2002  (JP)  ............................. 2002-256533
Mar. 10, 2003  (JP)  ............................. 2003-062938

(51) Int. Cl.
  *H01L 21/00*  (2006.01)
  *H01I 21/26*  (2006.01)
(52) U.S. Cl. ....................... 438/166; 438/487; 438/795
(58) Field of Classification Search .................. 438/96, 438/97, 149, 166, 306, 795–799, 486, 487
See application file for complete search history.

(56) References Cited

U.S. PATENT DOCUMENTS

| | | | |
|---|---|---|---|
| 5,748,165 A | 5/1998 | Kubota et al. | |
| 6,136,632 A | 10/2000 | Higashi | |
| 6,322,625 B1 | 11/2001 | Im | |
| 6,594,064 B1 | 7/2003 | Hirabayashi | |
| 6,632,711 B1 | 10/2003 | Sugano | |
| 6,943,086 B1* | 9/2005 | Hongo et al. | 438/308 |
| 7,023,500 B1* | 4/2006 | Kikuchi et al. | 349/43 |
| 2002/0031876 A1 | 3/2002 | Hara | |
| 2002/0102824 A1* | 8/2002 | Voutsas et al. | 438/488 |
| 2002/0119609 A1 | 8/2002 | Hatano | |
| 2004/0072411 A1* | 4/2004 | Azami et al. | 438/482 |
| 2004/0127066 A1* | 7/2004 | Jung | 438/778 |
| 2005/0161432 A1* | 7/2005 | Doan | 216/58 |

(Continued)

FOREIGN PATENT DOCUMENTS

JP  5-283356  10/1993

(Continued)

OTHER PUBLICATIONS

Takeuchi, et al., "Perforamance of Poly-Si TFTs Fabricated by a Stable Scanning CW Laser Crystallization", TFT4-3, pp. 251-254.

*Primary Examiner*—Savitri Mulpuri
(74) *Attorney, Agent, or Firm*—Antonelli, Terry, Stout and Kraus, LLP.

(57) ABSTRACT

The active layer (active region) of the thin-film transistor making up the driver circuit is obtained by reformation implemented by scanning the continuous-wave laser light, condensed into a linear form or a rectangle form extremely longer in the longitudinal direction than in the transverse direction, along a given direction crossing the longitudinal direction. This is made up of a poly silicon film containing crystal grains having no grain boundaries crossing the direction of current flow, that is, a band-like polycrystalline silicon film. As a result, it is possible to implement a display device having stable and high quality active elements outside the display region on the insulating substrate.

6 Claims, 27 Drawing Sheets

U.S. PATENT DOCUMENTS

| | | | |
|---|---|---|---|
| 2005/0169330 A1* | 8/2005 | Hongo et al. | 372/38.02 |
| 2005/0170572 A1* | 8/2005 | Hongo et al. | 438/166 |
| 2005/0214959 A1* | 9/2005 | Hatano et al. | 438/16 |
| 2005/0236299 A1* | 10/2005 | Yamazaki et al. | 438/795 |

FOREIGN PATENT DOCUMENTS

| | | |
|---|---|---|
| JP | 7-335547 | 12/1995 |
| JP | 2000-243970 | 9/2000 |
| JP | 2002-222959 | 8/2002 |
| KR | 2001-0087667 | 9/2001 |

* cited by examiner

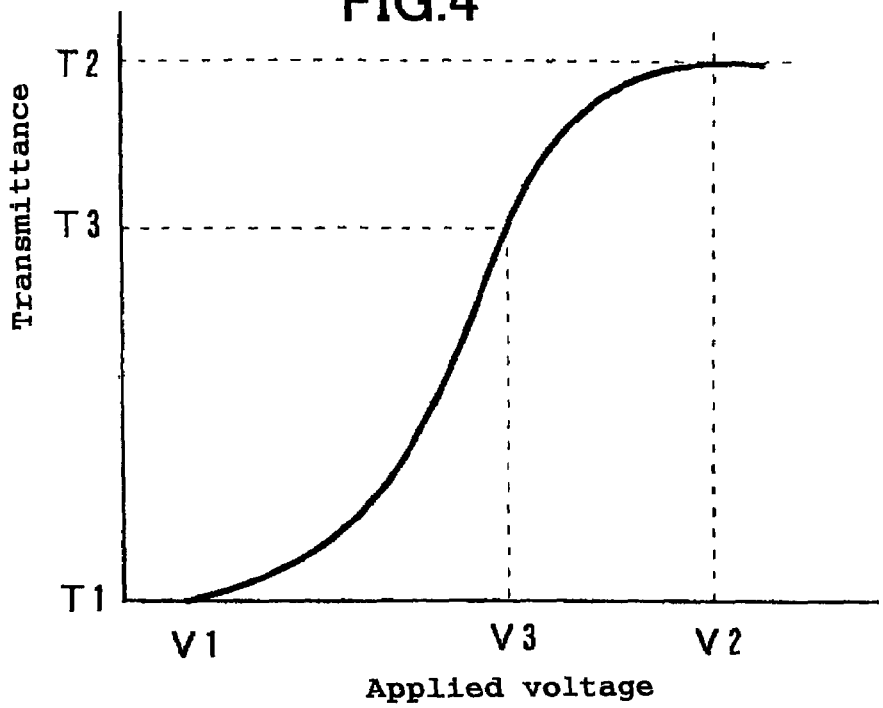
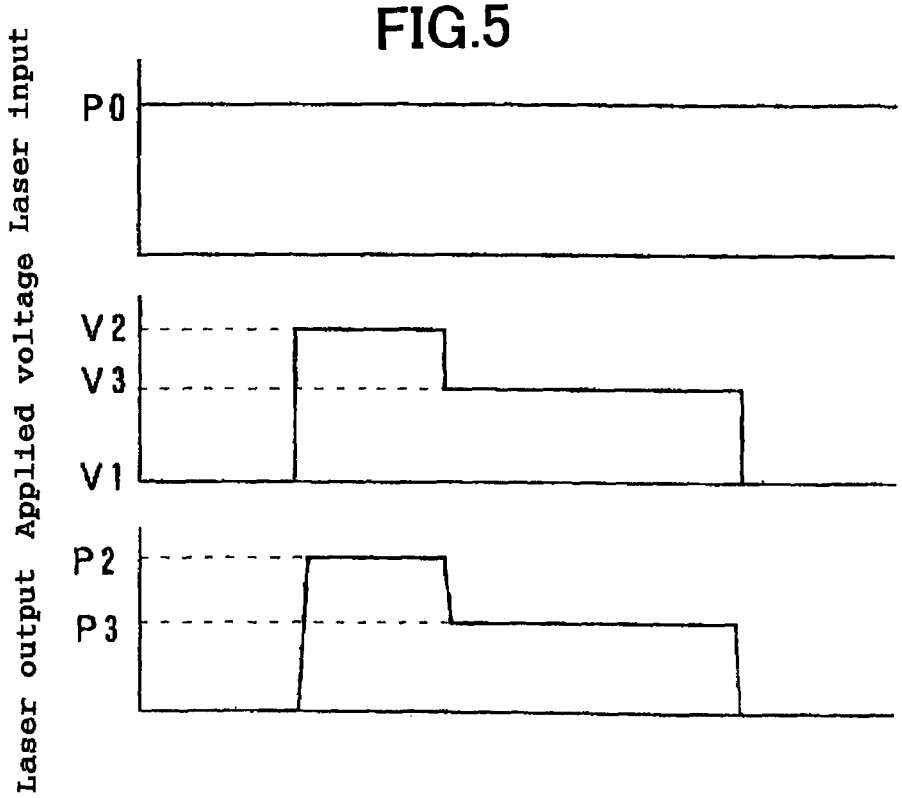

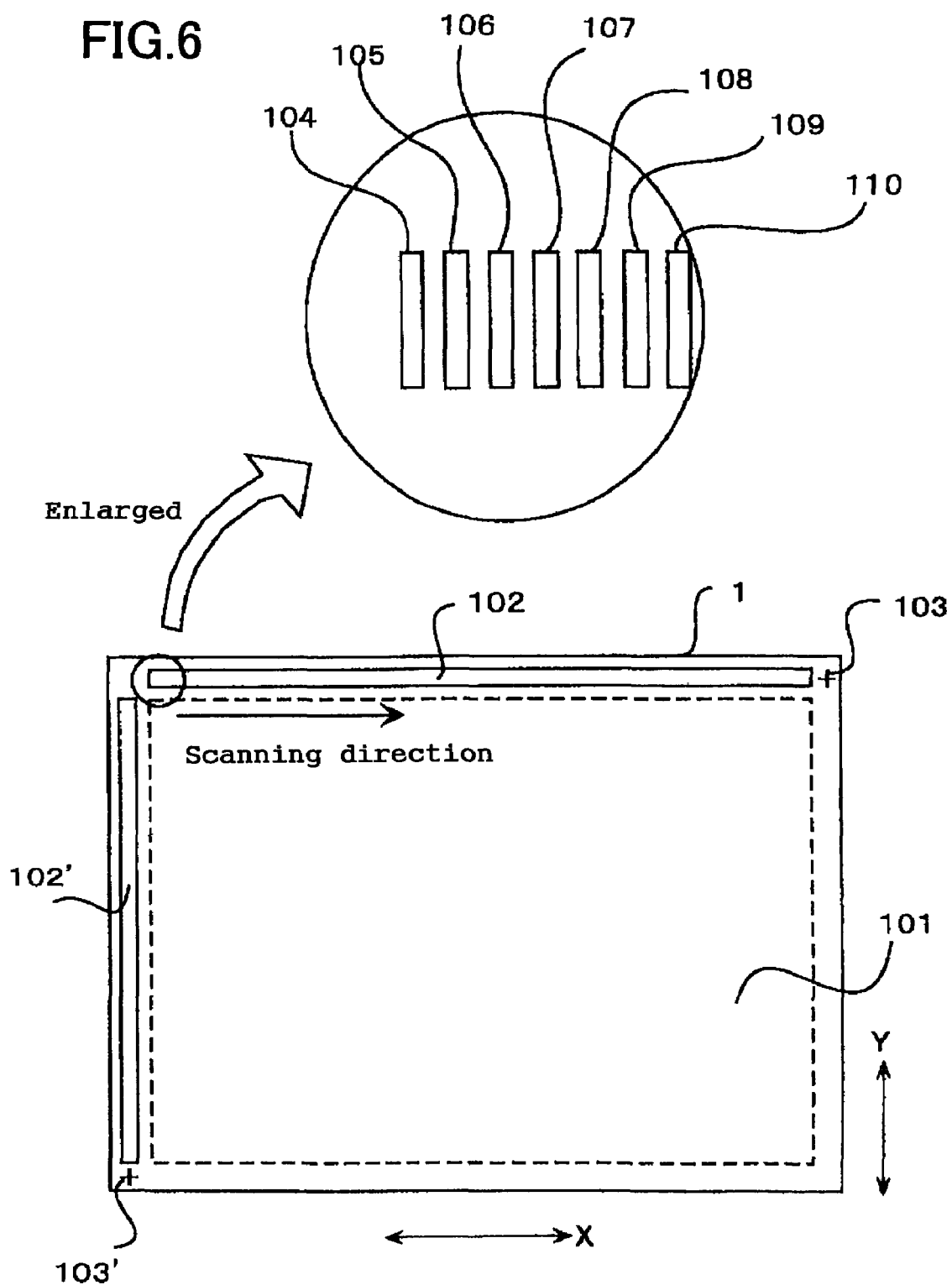

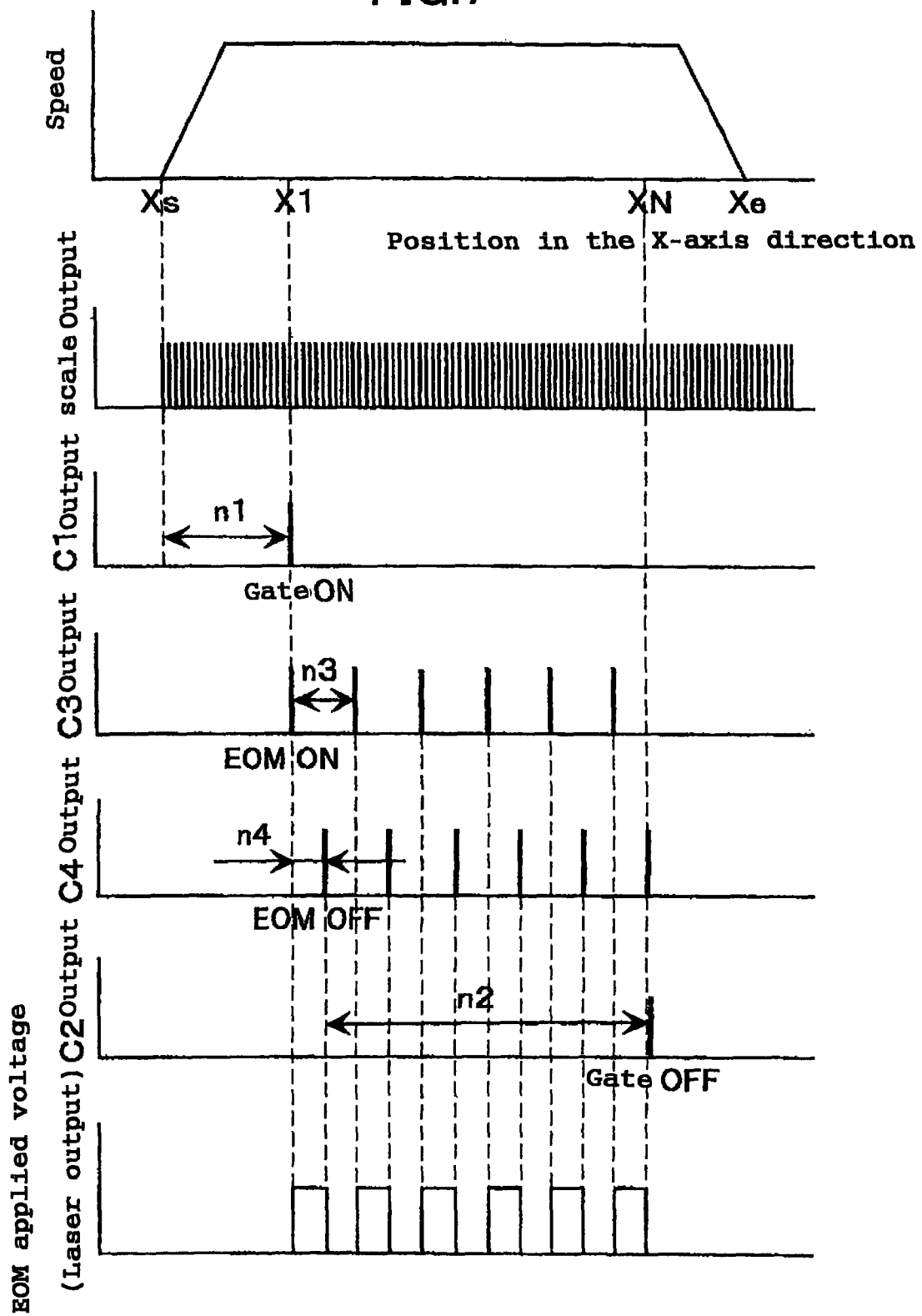

Laser irradiation region

FIG.12
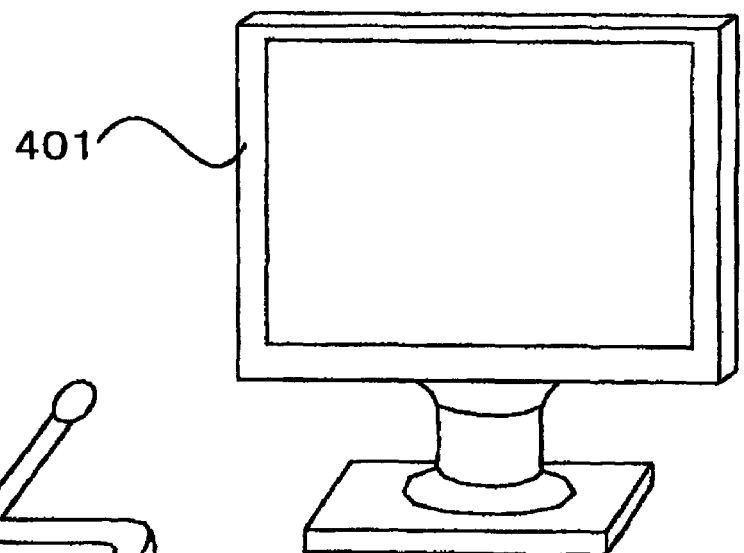
(a)
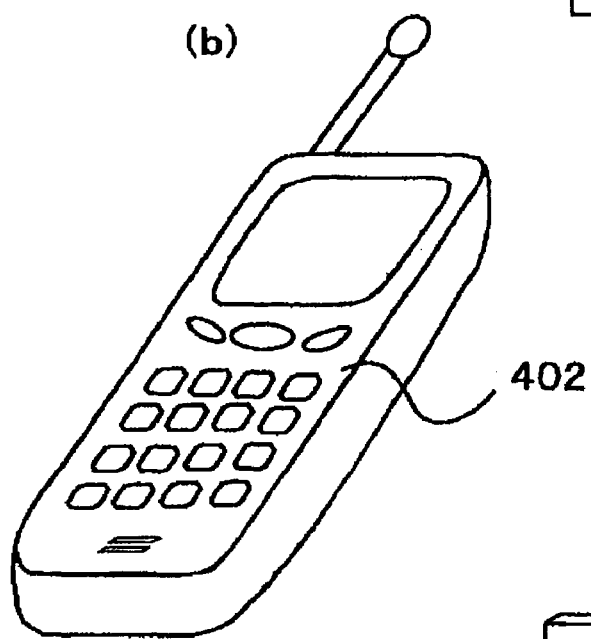
(b)
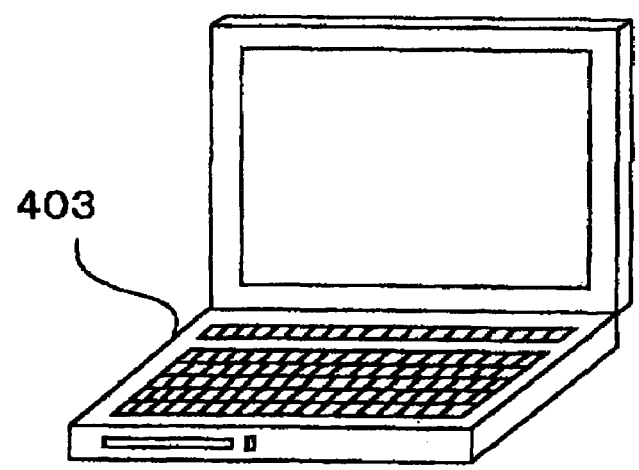
(c)

FIG.19
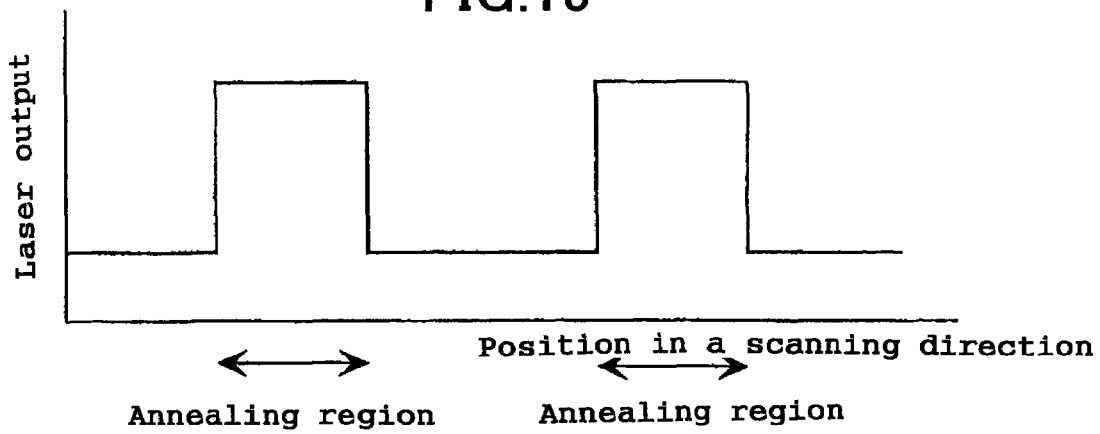
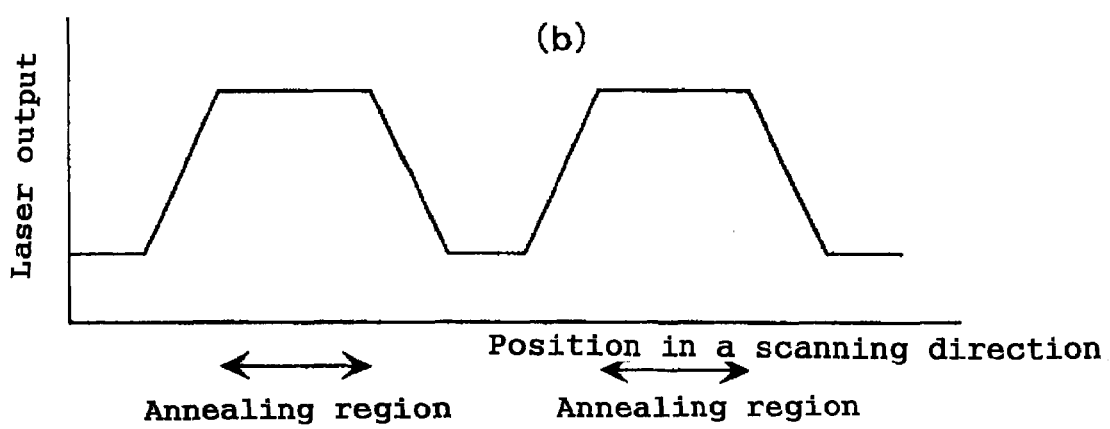
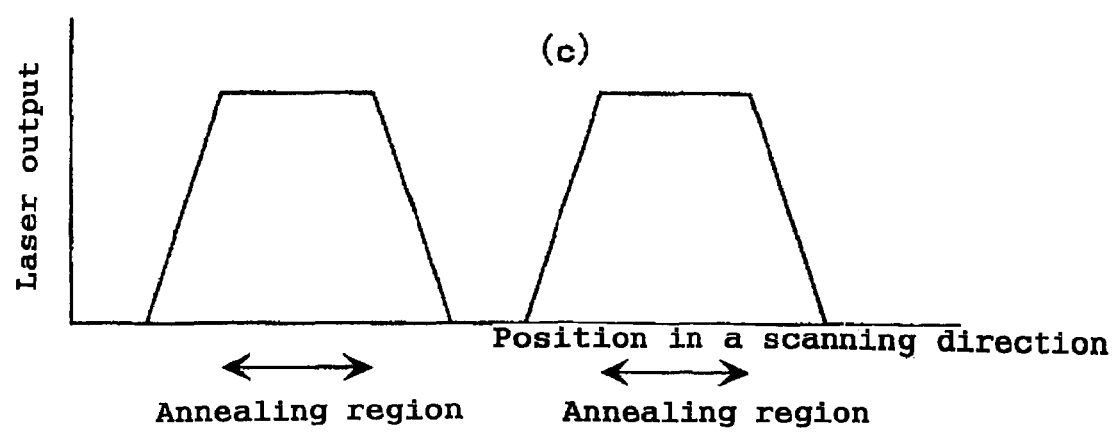

FIG.25
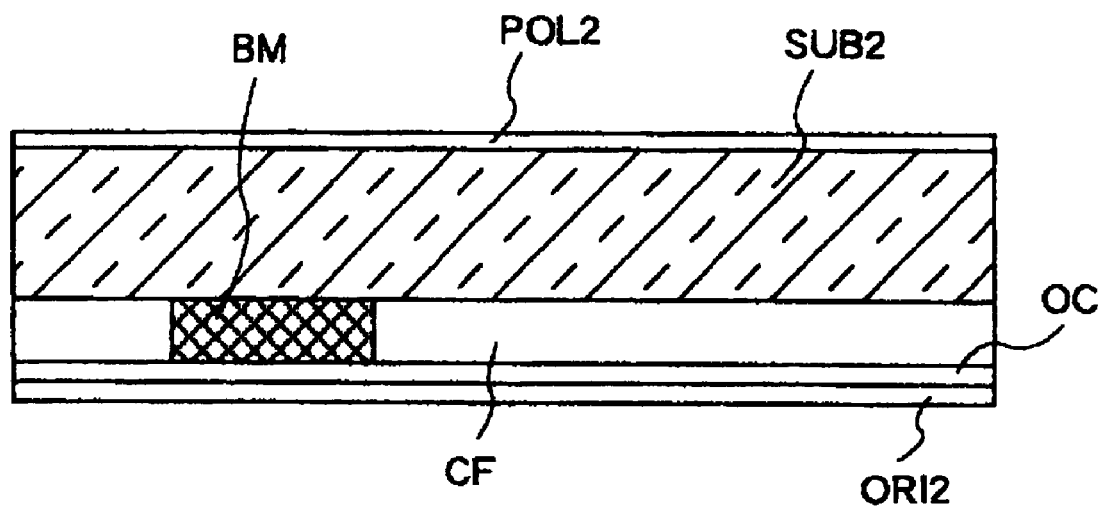
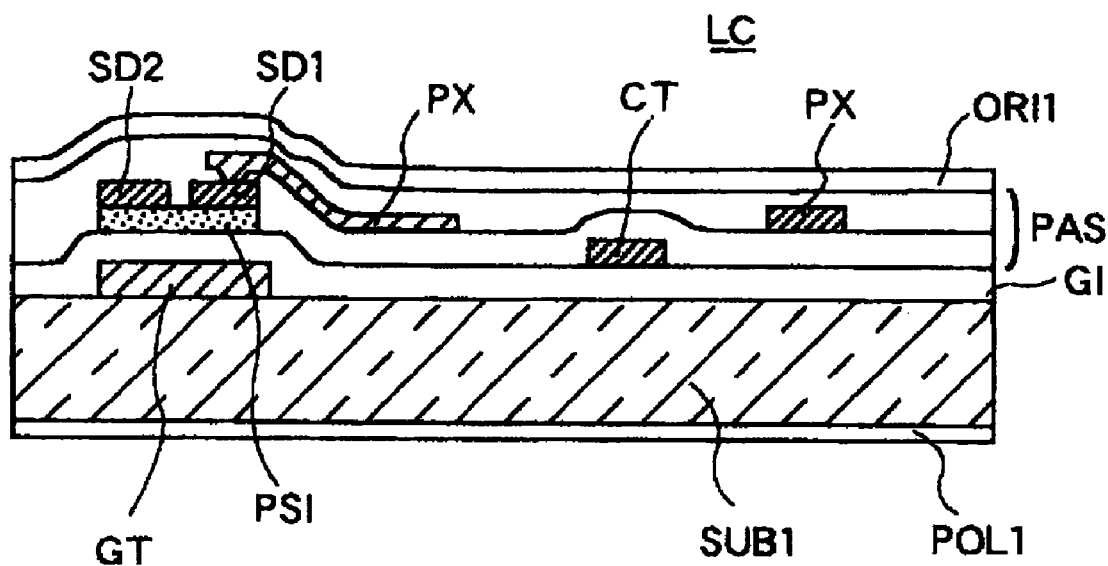

DISPLAY DEVICE, PROCESS OF FABRICATING SAME, AND APPARATUS FOR FABRICATING SAME

BACKGROUND OF THE INVENTION

1. Field of the Invention

The present invention relates to a flat panel display device, and in particular, to a display device using an insulating substrate with active elements formed in a band-like polycrystalline semiconductor film, obtained by reforming an amorphous or granular polycrystalline semiconductor film formed on the top surface of the insulating substrate so as to expand crystal grains into a substantially band-like shape by use of annealing with laser light (also referred to merely as laser hereinafter) irradiated thereto to, a process of fabricating the same, and an apparatus for fabricating the same.

2. Description of Related Art

This type of display device comprises a multitude of data lines (drain lines for thin-film transistors) juxtaposed so as to be extended in a direction of the display region of an insulating substrate on one side (hereinafter referred to also as an active matrix substrate, and as a thin-film transistor substrate in the case where thin-film transistors are used as the active elements), with active elements such as thin-film transistors, thin-film diodes, and so forth, formed thereon, a multitude of scanning lines (gate lines for thin-film transistors) juxtaposed so as to be extended in another direction crossing the direction described as above, active elements formed of a granular polycrystalline silicon film (polysilicon film) as a semiconductor film formed on the active matrix substrate and disposed at cross-over points of the data lines and the scanning lines, and pixels arranged in a matrix form, made up of pixel circuits having pixel electrodes driven by the active elements, respectively. There will be described hereinafter mainly of a display device using a silicon film as the semiconductor film and thin-film transistors, which are typical active elements, as the active elements.

With a flat panel display device of the present day, pixel circuits comprising thin-film transistors, respectively, are made up of a non-crystalline silicon film (hereinafter referred to also as amorphous silicon film) and a granular polycrystalline silicon film (hereinafter referred to also as polysilicon film) as a semiconductor film on top of an insulating substrate, made of glass, fused glass, etc., serving as an active matrix substrate, and pixels are selected by switching of the respective thin-film transistors of the pixel circuits, thereby forming images.

The thin-film transistor constituting each of the pixel circuits is driven by a driving circuit (hereinafter referred to also as driver circuit or driver) mounted on the periphery of the active matrix substrate. The granular polycrystalline silicon film described above is a silicon film which crystal grains are small in diameter as will be described later. Herein, "crystal grains are small in diameter" means a size so small that, for example, there exist a multitude of grain boundaries of silicon crystals in an active layer (or active region) of the thin-film transistor, that is, within a so-called channel width, thereby causing current passing through the active layer to cut across the multitude of the grain boundaries of the silicon crystals without fail.

If it becomes possible to form the driver circuit for driving the thin-film transistors of the pixel circuits concurrently with the thin-film transistors of the pixel circuits, drastic reduction in production cost and enhancement in reliability can be expected. However, because the conventional polysilicon film, which is a semiconductor layer for forming the active layer of the thin-film transistor, has poor crystallinity (crystal grains are small in grain size), operation performance (operation characteristic) represented by mobility of electrons or holes is low, so that it is difficult to fabricate a circuit of which high-speed and high function are required. In order to fabricate the circuit having high-speed and high function, high-mobility thin-film transistors are required, but to implement this, there is the need for improving the crystallinity of the polysilicon film. Improvement on the crystallinity means primarily expansion of the grain size of the crystal grains or rendering a dimension in one direction of the crystal grains to be greater than a dimension thereof, in other directions, so as to be turned into a band-like or stripe like shape, thereby increasing the dimensions thereof. Herein, to differentiate from the conventional polysilicon film, the silicon film as reformed is referred to a band-like polysilicon film.

As a method for improving the crystallinity of a polysilicon film, there has since been known annealing with laser light such as excimer laser, and so forth. With this method, by irradiating, for example, excimer laser to an amorphous silicon film formed on top of an insulating substrate (also referred to merely as a substrate hereinafter), made of glass, fused glass, etc., the amorphous silicon film is turned into a polysilicon film, thereby improving the mobility. However, the polysilicon film obtained by irradiation with the excimer laser is on the order of several 100 nm in grain size, and the mobility thereof is on the order of 100 $cm^2/Vs$, so that the performance thereof is insufficient for use in the driver circuit for driving a liquid crystal panel.

As a method of overcoming the problem, annealing techniques with the use of continuous-wave laser as described in Non-patent Document 1. Patent Document 1 has description to the effect that by maintaining the pulse width of pulse laser light in a range of 1 μs to 100 ms, it is possible to reduce fluctuation in threshold value of transistor fabricated. Further, description concerning reformation of a silicon film by irradiation of laser light is given in Patent Document 2.

[Non-patent Document 1]
F. Takeuchi et al "Performance of poly-Si TFTs fabricated by a Stable Scanning CW Laser Crystallization" AM-LCD '01 (TFT4-3)

[Patent Document 1]
JP-A No. 335547/1995

[Patent Document 2]
JP-A No. 283356/1993

SUMMARY OF THE INVENTION

With the conventional techniques described in [Non-patent Document 1] described, by scanning the second harmonics of LD (laser diode) pumped $YVO_4$ continuous wave laser on an amorphous silicon film formed on the surface of a glass substrate to thereby cause growth of crystal grains to occur, mobility in excess of 500 $cm^2/Vs$ was obtained. If mobility at this level is achieved, a driver circuit high in performance can be formed and a so-called system on panel (or chip on glass: COG) mounting can be implemented.

However, according to the conventional techniques described in [Non-patent Document 1], irradiation is performed by scanning the whole surface of a region on the substrate, for forming a driver circuit, with the continuous wave laser, and no consideration is given to an idea of irradiation of necessary parts only. Accordingly, a wide region including a part with high mobility where the driver circuit is formed and the periphery thereof is continuous irradiated. As a result, after start of laser irradiation, laser absorbed by a silicon film is converted into heat, and accumulated in the substrate, so that the silicon melts and undergoes aggregation by the agency of interfacial tension or thermal damage occurs to the substrate. In order to solve the problem, it is sufficient to selectively irradiate laser light to necessary regions only. Since irradiation is applied to specific spots on the substrate being moved at a high speed relative to laser, means for implementing laser irradiation start and stoppage with high precision have not been known so far. So, this has been one the pending problems.

Further, in [Patent Document 1], it has been disclosed that fluctuation in the threshold value of a transistor produced by setting a pulse width of pulse laser light to a range of 1 to 100 μs.

However, no thought has been given to a method of irradiating laser light to a specific spot on a substrate being moved at a high speed relative to laser. This has been another problem to be solved.

The present invention has been developed in view of the problem described as above, and a fist object of the invention is to provide a display device comprising an active matrix substrate having active elements such as thin-film transistors in a stable and high quality semiconductor film (silicon film) formed only at desired position on an insulating substrate. A second object of the invention is to provide a process of fabricating the display device, enabling a stable and high quality silicon film to be formed only at desired position on the insulating substrate. A third object of the invention is to provide an apparatus for implementing the process of fabricating the display device.

To attain the fist object, the insulating substrate (the active matrix substrate) of the display device according to the invention comprises a multitude of data lines juxtaposed so as to be extended in a direction on the top surface of the insulating substrate, and a multitude of scanning lines juxtaposed so as to be extended in another direction crossing the direction. There are also provided pixel circuits having active elements (also referred to as thin-film transistors) such as thin-film transistors, disposed in the vicinity of cross-over points of the data lines and the scanning lines. The thin-film transistors are made of a band-like polycrystalline silicon film having crystallinity described and disposed in a matrix form in a display region. The respective pixels are made up of pixel circuits having pixel electrodes driven by the active elements, respectively.

A driving circuit (hereinafter referred to as driver circuit) is divided and formed at a plurality of spots on at least one side of the insulating substrate. The active layer (active region) of the thin-film transistor making up the driver circuit is obtained by reformation implemented by scanning the continuous-wave laser light, condensed into a linear form or a rectangle form extremely longer in the longitudinal direction than in the transverse direction, along a given direction crossing the longitudinal direction. This is made up of a poly silicon film containing crystal grains having no grain boundaries crossing the direction of current flow, that is, a band-like polycrystalline silicon film.

To attain the second object, the process of fabricating the display device made up of a thin-film transistor substrate comprises the steps of: taking out continuous-wave laser light at timing required by use of an electro-optical modulator (hereinafter referred to also EO modulator); forming the continuous-wave laser light into linear or rectangular form as described above; irradiating the laser light thus formed only to necessary portions including the thin-film transistor part making up the driver circuit disposed on the outside of the display region, and periphery thereof out of amorphous silicon film and amorphous silicon film composed of fine crystal grains, formed on the entire top surface of the insulating substrate such as glass and so forth.

The thin-film transistor substrate with the top surface thereof facing upward is mounted on the stage making relative movement in relation to the laser light, and the above-described necessary portions of the thin-film transistor substrate are irradiated and scanned by the laser light, thereby implementing reformation. Such scanning is executed such that a pulse signal generated by the linear scale and so forth for detecting the position of the stage following movement of the stage is counted, and at a time when a position where the thin-film transistor is to be formed is reached, irradiation of the laser light is started. Further, the pulse signal is counted, and at a time when a region where the laser light is to be irradiated is passed, irradiation of the laser light is stopped. Such operation is repeated while the stage is kept in constant movement.

With the invention, while the stage is kept in continuous movement, only necessary pats can be irradiated with the laser light by turning the continuous-wave laser light ON/OFF, and parts where the laser irradiation is not required will not be irradiated, so that occurrence of melting or aggregation of the silicon film can be prevented. Also, it is possible to prevent thermal damage to a glass substrate etc. as the thin-film transistor substrate. Further, since the start and stoppage of the laser light irradiation can be controlled on the basis of the position of the stage, high precision irradiation start and stop is ensured even there occurs variation in the moving speed of the stage.

In Patent Document 2, there has been disclosed a configuration wherein a laser pulse is emitted when a laser irradiation position is opposed to a laser irradiation position as a technology to irradiate laser light accurately. In this technology, no consideration is given to the control adopted by the present invention, that is, while keeping the stage in movement, irradiation of the continuous-wave laser light is started at a specified position and after irradiation for a predetermined time (predetermined distance), irradiation is stopped.

BRIEF DESCRIPTION OF THE DRAWINGS

These and other features, objects and advantages of the present invention will become more apparent from the following description when taken in conjunction with the accompanying drawing wherein:

FIG. 4 is a graph showing a relationship between applied voltage and transmittance in the EO modulator;

FIG. 5 is a graph showing a relationship among laser input, applied voltage, and laser output in the EO modulator;

FIG. 6 is a plan view for illustrating the glass substrate as the object for a laser annealing method, which is an embodiment of a process of fabricating the display device according to the invention, and an enlarged view of the principal part thereof is also shown in the figure;

FIG. 7 is a time chart for illustrating the embodiment of the process of fabricating the display device, according to the invention, showing timing of shifting the stage 2 and irradiating the laser light, respectively;

FIG. 12 is a schematic representation for illustrating electronic equipment with the display device of the invention mounted therein;

FIG. 19 is a schematic representation for illustrating a relationship between a stage position according to another embodiment of the invention and laser output;

FIG. 25 is a sectional view of the principal part of a liquid crystal display panel of a liquid crystal display device which is an example of an embodiment of a display device according to the invention for illustrating another example of configuration thereof;

DETAILED DESCRIPTION OF THE PREFERRED EMBODIMENTS

Embodiments of the invention are described in detail hereinafter with reference to the accompanying drawings.

Figure 1:
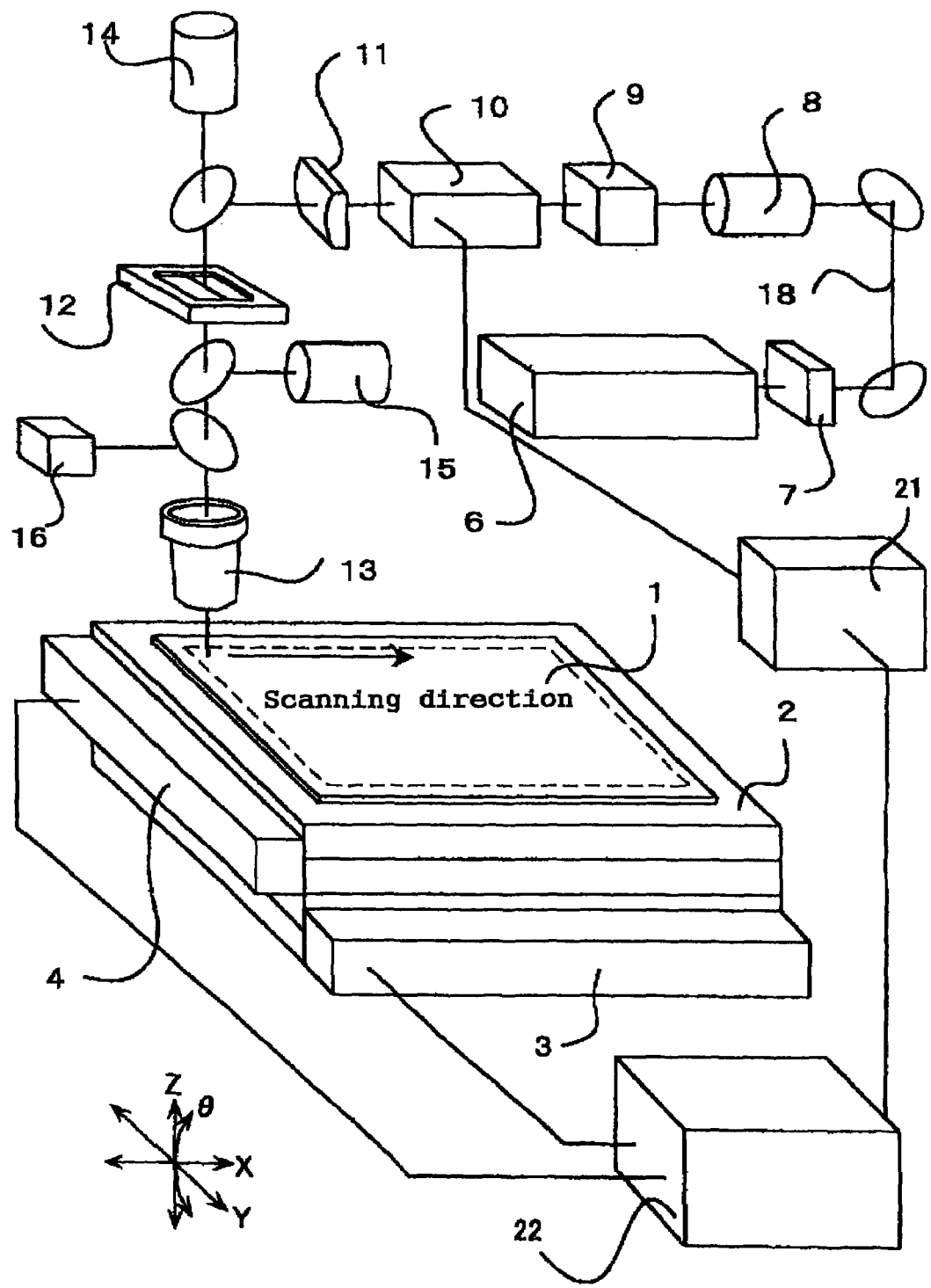
FIG. 1 is a block diagram for schematically illustrating an embodiment of an apparatus of fabricating a display device according to the invention for carrying out an embodiment of a process of fabricating the display device according to the invention.

FIG. 1 is a block diagram for schematically illustrating an embodiment of an apparatus of fabricating a display device according to the invention for carrying out an embodiment of a process of fabricating the display device according to the invention. In this case, for an insulating substrate to serve as a thin-film transistor substrate, a glass substrate is used. A glass substrate 1 is movable in one direction (X) and in another direction (Y) crossing the one direction (X) at right angles, and is placed on a XYθ stage 2 (hereinafter referred to as merely stage) capable of adjusting both the directions (θ). The stage 2 fixedly attached to a platen (not shown) having a vibration isolation mechanism is provided with linear scales (also referred to as linear encoders) 3, 4, for detecting coordinates in the X direction and the Y direction, respectively.

A laser light irradiation system (an annealing optical system) for performing reformation of a silicon film comprises a laser oscillator 6 for oscillating continuous-wave laser light 18, a shutter 7 for prevention of inadvertent irradiation of the continuous-wave laser light 18, a beam expander 8 for expanding the beam diameter of the continuous-wave laser light 18, a continuously variable transmittance filter 9 for adjusting output (energy) of the continuous-wave laser light 18, an EO (electro-optical) modulator 10 for turning the continuous-wave laser light 18 ON/OFF and modulating the laser light 18 time-wise as necessary, a power source (driver) 21 of the EO modulator 10, a beam forming optics 11 for compressing the continuous-wave laser light 18 in one direction to be converted into linear beams, an electromotive rectangular slit 12 for cutting out only a necessary portion of the continuous-wave laser light 18 converted into the linear beams, an objective lens 13 for projecting the continuous-wave laser light 18 passing through the electromotive rectangular slit 12 on the glass substrate 1, a slit reference light source 14 for checking irradiation position and shape of the continuous-wave laser light 18, an overhead illuminating light source 15 for shining the surface of the glass substrate 1, and a CCD camera 16 for observation of a glass substrate face or detection of alignment marks at the time of alignment as necessary.

The laser light irradiation system further comprises a controller 22 for performing opening/closing of the shutter 7, adjustment of transmittance of the continuously variable transmittance filter 9, control of the power source (driver) 21 of the EO modulator 10, control of the electromotive rectangular slits 12, control of the stage 2, processing of respective signals from the linear scales 3, 4, processing of images detected by the CCD camera 16, and so forth. In FIG. 1, as for electrical connection, there is shown relationship only among the linear scales (linear encoders) 3, 4, the controller 22, the EO modulator 10, and the power source (driver) 21.

For the laser oscillator 6, use is made of one for generating for oscillating continuous oscillation laser light of ultraviolet or visible light wavelength, and in particular, one for generating the second harmonics of LD (laser diode) pumped $YVO_4$ continuous wave laser is optimum from the viewpoint of magnitude of output, stability, and so forth. However, the invention is not limited thereto, use may be made of harmonics and so forth of argon laser and YAG laser. The shutter 7 is installed to prevent inadvertent irradiation of the continuous-wave laser light 18 in the course of transit of the glass substrate 1, positioning thereof, and so forth, and is not intended for use to turn the continuous-wave laser light 18 ON/OFF at the time of laser annealing. The beam expander 8 is intended to expand the beam diameter in order to prevent damage from occurring to crystals, in particular, of Pockels cell, and so forth, constituting the EO modulator 10, however, in the case of using Pockels cell capable of withstanding high energy density, use of the beam expander 8 may be unnecessary.

The continuous-wave laser light 18 oscillated by the laser oscillator 6 passes through the shutter 7 in open state, and is expanded in beam diameter by the beam expander 8 to subsequently fall on the EO modulator 10. In this stage, the beam diameter is expanded by the beam expander 8 to a size close to the effective diameter of the EO modulator 10 taking power resistance of the EO modulator 10 into account. In the case where the beam diameter of the continuous-wave laser light 18 oscillated by the laser oscillator 6 is approximately 2 mm, and the EO modulator 10 with the effective diameter of 15 mm is used, a suitable ratio of expansion by the beam expander 8 is from about 3 to 5 times. The laser light 18 with the beam diameter expanded by the beam expander 8 falls on the EO modulator 10.

Figure 2:
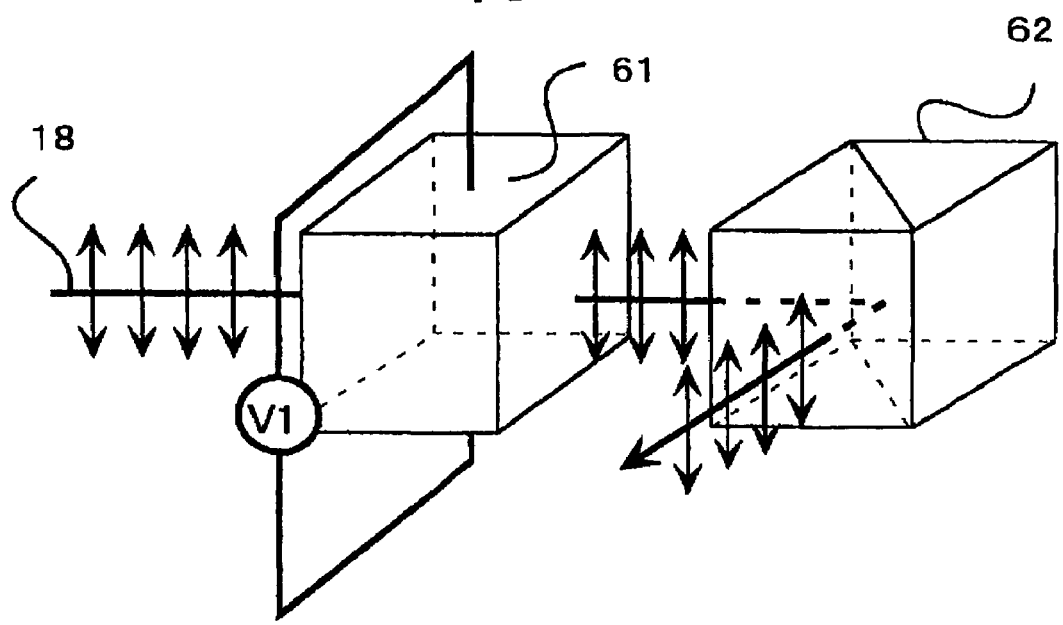
FIG. 2 is a perspective view of the EO modulator 10 in FIG. 1 for explaining the function thereof.
Figure 3:
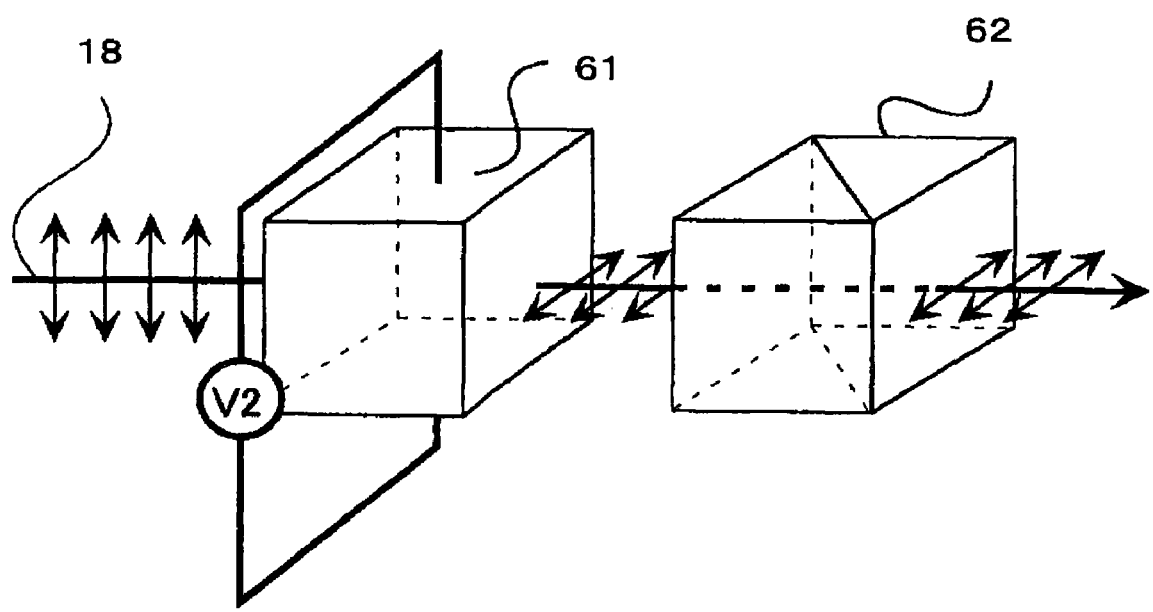
FIG. 3 is another perspective view of the EO modulator 10 in FIG. 1 for explaining the function thereof.

FIG. 2 is a perspective view of the EO modulator 10 in FIG. 1 for explaining the function thereof. FIG. 3 is another perspective view of the EO modulator 10 in FIG. 1 for explaining the function thereof. As shown in FIGS. 2 and 3, the EO modulator 10 in this case comprises a Pockels cell 61 (hereinafter also referred to as a crystal) combined with a polarized beam splitter 62. If the laser light 18 is a linearly polarized light, it is set such that by applying voltage V1 (normally voltage 0V) to the crystal 61 via a power source (not shown) of the EO modulator 10, as shown in FIG. 2, a polarization direction of the laser light 18 passing through the crystal 61 is not rotated to be maintained as it is, and falls as S polarized light on the polarized beam splitter 62 to be thereby deflected by 90 degrees. That is, in this state, since the laser light 18 is sent out after deflection by 90 degrees, the laser light 18 does not fall on the rest of the laser light irradiation system, and is in OFF state on top of the glass substrate 1.

Further, by applying voltage V2 capable of rotating the direction of polarization of the laser light 18 passing through the crystal 61 by 90 degrees as shown in FIG. 3, the direction of polarization of the laser light 18 passing through the crystal 61 is rotated by 90 degrees and falls as P polarized light on the polarized beam splitter 62, whereupon the laser light 18 passes through the polarized beam splitter 62, and travels in a straight line. That is, in this state, since the laser light 18 travels in the straight line, and falls on the rest of the laser light irradiation system, the laser light 18 is in ON state on top of the glass substrate 1.

FIG. 4 is a graph showing a relationship between applied voltage and transmittance in the EO modulator. As is evident from the relationship between voltage applied to the crystal 61 and transmittance of the laser light 18 passing through the EO modulator 10, shown in FIG. 4, the transmittance of the laser light 18 passing through the EO modulator 10 can be set suitably between T1 (normally 0) and T2 (herein, the maximum transmittance, that is, 1) by varying the voltage applied to the crystal 61 between V1 (normally, 0V) and V2. That is, the transmittance of the laser light 18 passing through the EO modulator 10 can be set suitably between 0 and 1. In this case, however, it is presumed that reflection and absorption do not take place on the surface of the crystal 61 and the polarized beam splitter 62, respectively.

FIG. 5 is a graph showing a relationship among laser input, applied voltage, and laser output in the EO modulator. On the basis of description given with reference to FIGS. 3 and 4, by varying voltage applied to the crystal 61 to V1, V2, V3, and V1 in stages while output (input to the EO modulator 10) of the laser light 18 falling on the EO modulator 10 is kept constant, pulse output of P2, P3 in stages as laser output from the EO modulator 10 can be obtained as shown in FIG. 5. Herein, the output P2 is found as the product of the input to the EO modulator 10, P0, and the transmittance T2 when the voltage V2 is applied and the output P3 is found as the product of the input P0, and the transmittance T3 when the voltage V3 is applied. It is evident that the laser light 18 passing through the EO modulator 10 can be successively varied by successively varying the voltage applied to the crystal 61, so that the laser light 18 pulsing and having variation with time can be obtained.

Now, it has been described hereinabove that the Pockels cell 61 in combination with the polarized beam splitter 62, is used as the EO modulator 10, however, in place of the polarized beam splitter 62, various sheet polarizers can be used. In description given hereinafter, the Pockels cell 61 in combination with the polarized beam splitter 62 (or sheet polarizer) will be referred to as the EO modulator 10.

Further, besides the EO modulator 10, an AO (acousto-optical) modulator may be used. However, because the AO modulator generally has a lower driving frequency as compared with the EO modulator, there is a possibility of the AO modulator being unsuitable in the case where fast rising and falling are required or pulse light with a small pulse width is cut out. Thus, with the use of a modulator such as the EO modulator 10 or the AO modulator, in a state where the continuous-wave laser light is constantly sent out from the laser oscillator 6, it is possible to start irradiation to an optional spot of irradiation start on a part as the object of irradiation, and to complete irradiation to an optional spot of irradiation completion thereof.

The laser light 18 turned into ON state by the EO modulator 10 is formed into a beam in a desired shape by the beam forming optics 11. Since an output beam from a gas laser oscillator and a solid-state laser oscillator, respectively, normally has Gaussian energy distribution circular in shape, the same cannot be used as it is for the laser annealing according to the invention. If output from the oscillator is sufficiently large, by sufficiently expanding the beam diameter of the laser light, and cutting out a necessary shape from a relatively uniform portion at the center thereof, a suitable shape with substantially uniform energy distribution can be obtained, however, this result in discarding the peripheral part of the laser light, so that most of energy will be wasted.

In order to convert the Gaussian distribution into a uniform distribution for overcoming the shortcoming, a beam homogenizer is used as necessary. Otherwise, by condensing the laser light 18 only in one direction with a cylindrical lens, a linear beam can be obtained on the surface of the electromotive rectangular slit 12. In FIG. 1, the cylindrical lens only is shown as the beam forming optics 11.

Now, reverting to FIG. 1, operation of the fabrication apparatus according to the invention is described hereinafter. Unnecessary peripheral portions of the laser light 18 condensed into a linear form by the cylindrical lens 11 are cut off by the electromotive rectangular slit 12 to be thereby formed into a rectangular form as desired (deemed as linear in macroscopic terms), which is then projected on the glass substrate 1 by the objective lens 13 after demagnification. In the case of condensing the laser light into a linear form by the cylindrical lens 11, energy distribution in the longitudinal direction remains as Gaussian while energy distribution on both edges is lower.

Accordingly, low energy density portions thereof, normally unsuitable for annealing, are cut off by the electromotive rectangular slit 12. As a result, by scanning the laser light condensed in a linear form in the direction of the width thereof, an annealing process can be satisfactorily applied an entire scanned part. Assuming that a magnification of the objective lens 13 is M, an image of the electromotive rectangular slit 12, or the laser light 18 passing through the face of the electromotive rectangular slit 12 is projected in size corresponding to the reciprocal of the magnification, that is, 1/M.

Upon irradiation of the glass substrate 1 with the laser light 18, the laser light 18 is irradiated to a desired spot at a pulse while the stage 2 is being shifted in an X-Y plane, but if defocusing occurs due to asperities, undulation, and so forth, present on the surface of the glass substrate 1, there occurs variation in power density of the laser light 18 as condensed and deterioration in irradiation shape, so that an intended object cannot be attained. Accordingly, by detecting a focusing position with an automatic focusing optical system (not shown) to enable irradiation to be directed to the focusing position all the time, control is implemented such that the focusing position (projection position of the face of the electromotive rectangular slit 12) is in agreement with the glass substrate 1 all the time by driving the stage 2 in the Z-direction (height direction) or by driving the optical system in the Z-direction (height direction) in case the laser light 18 is off the focusing position. The surface of the glass substrate 1 irradiated with the laser light 18 can be illuminated by illuminating light from the overhead illuminating light source 15.

The surface of the glass substrate 1 is photographed with the CCD camera 16 so as to be observed with a monitor (not shown). When observing the surface of the glass substrate 1 during laser irradiation, a laser cut filter is inserted before the CCD camera 16 to thereby prevent halation from occurring to the CCD camera 16 caused by the laser light 18 reflected from the surface of the glass substrate 1, resulting in failure to observe, and to prevent occurrence of damage to the CCD camera 16 in the extreme case.

Alignment of the glass substrate 1 placed on the stage 2 can be made along three axes of X, Y, θ by driving the stage 2 after taking pictures of the alignment mark provided on the glass substrate 1, corners of the glass substrate 1, or specific patterns at a plurality of spots, with use of the objective lens 13 and the CCD camera 16, and calculating coordinates of respective positions thereof by performing image processing such as binarization processing of those pictures, and pattern matching, etc. with the controller 22, respectively, as necessary.

In FIG. 1, only one piece of the objective lens 13 is shown, however, by fitting an electromotive revolver with a plurality of objective lenses, and changing over those objective lenses as appropriate, proper use can be made of an optimal one of those objective lenses, corresponding to the content of processing. More specifically, use can be made of an objective lens optimal to the alignment at the time of placing the glass substrate 1 on the stage 2, fine alignment to be executed if needed, laser annealing processing, observation after the processing, formation of an alignment mark which will be described later, and so forth, respectively. Alignment can be provided by installing an optical system (lens, camera, and illumination device) for exclusive use, however, use of the optical system for the laser annealing in common with an optical system for alignment enables detection along an identical optical axis, thereby enhancing precision of detection.

Now, there will be described hereinafter an embodiment of a process of fabricating a display device, that is, a process of laser annealing, according to the invention, using the above-described fabrication apparatus according to the invention. Herein, a glass substrate 1 as an object for annealing is obtained by forming an amorphous silicon film (a non-crystalline silicon film) 40 to 150 nm thick on the top surface of a glass substrate on the order of 0.3 to 1.0 mm thick through the intermediary of an insulator thin film, and by scanning across the amorphous silicon film with excimer laser light before crystallizing the same into a polysilicon film (polycrystalline silicon film). This is hereinafter referred to as merely the glass substrate 1 at times. In this case, the insulator thin film is a $SiO_2$, or SiN film, 50 to 200 nm thick, or a composite film thereof.

FIG. 6 is a plan view for illustrating the glass substrate as the object for a laser annealing method, which is an embodiment of a process of fabricating the display device according to the invention, and an enlarged view of the principal part thereof is also shown in the figure. The glass substrate 1 with the polysilicon film formed thereon after excimer laser annealing is placed on the stage 2 in FIG. 1. As shown in FIG. 6, the glass substrate 1 comprises a display region 101, which is a pixel part, and driver circuit regions 102, 102', and alignment marks 103, 103' are formed at least two spots on an outer edge thereof. These alignment marks 103, 103' may be formed by photo-etching techniques, however, use of a photo resist step for this purpose only will result in much wastage.

Accordingly, the laser light 18 for use in laser annealing is formed in the shape of, for example, a rectangle longer in the longitudinal direction and a rectangle longer in the transverse direction, respectively, in sequence by rotation of the cylindrical lens 11, and by use of the electromotive rectangular slit 12 to thereby remove portions of the polycrystalline silicon film, thus forming cross marks, which are to serve as the alignment marks 103, 103', respectively. Otherwise, dot-like alignment marks may be formed by ink-jet means and so forth. In these cases, pre-alignment needs to be provided in corners and so forth of the glass substrate 1.

While respective positions of the alignment marks 103, 103' are detected, and the positions are corrected in terms of X, Y, θ (X-axis, Y-axis, θ-axis), and subsequently, the optical system is shifted in the direction indicated by the arrow in FIG. 6 or the stage 2 is shifted in the direction opposite thereto in accordance with design coordinates so as to be relatively scanned, the laser light 18 turned into ON state by the EO modulator 10 is condensed by the objective lens 13 and is irradiated. Regions irradiated with the laser light 18 are, for example, driver circuit parts 102, 102', for driving the respective pixels, in a stricter sense, thin-film transistor forming regions of a driver part (parts indicated by 104, 105, 106, 107, 108, 109, and 110 in the enlarged view in FIG. 6, hereinafter referred to also as annealing regions). While the glass substrate 1 is reciprocatively shifted relatively a plurality of times as necessary, the laser light 18 is sequentially irradiated. Depending on a configuration of the fabrication apparatus, relative scanning may be executed by shifting the optical system.

Figure 16:
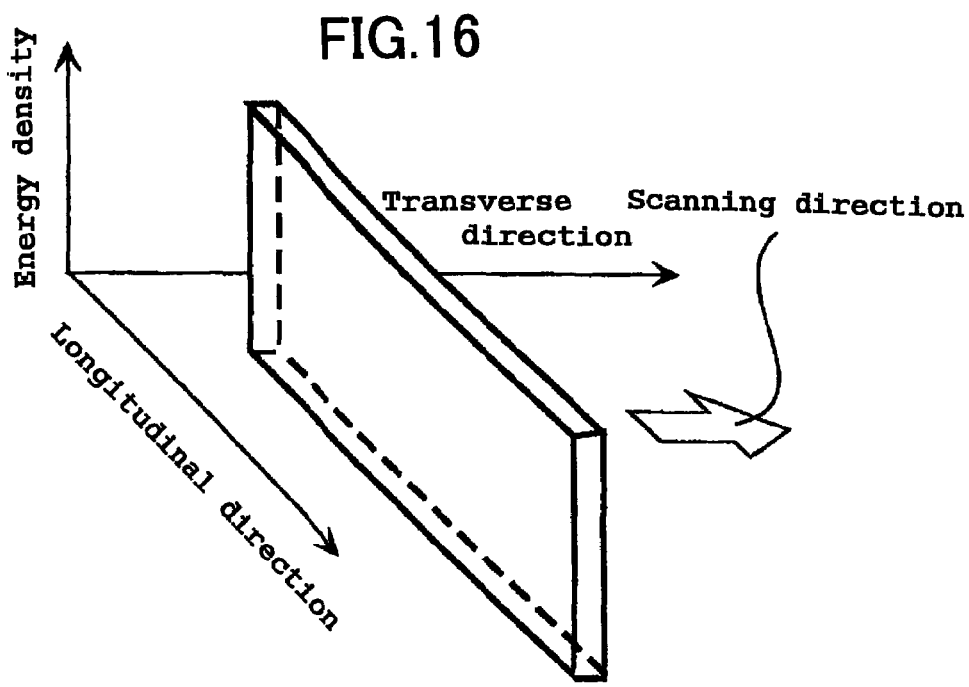
FIG. 16 is a perspective view for illustrating a condensed state of the laser light, suitable for the laser annealing according to the invention.

FIG. 16 is a perspective view for illustrating a condensed state of the laser light, suitable for the laser annealing according to the invention. Respective sizes of the annealing regions 104 through 110 are, for example, 4 mm×100 µm, and these rectangular regions are set at pitches of 250 µm. Meanwhile, the size of a laser beam irradiated is 500 µm×10 µm. That is, as shown in FIG. 16, the laser beam is formed in the shape of a rectangle (band) 500 µm in the longitudinal direction and 10 µm in the transverse direction.

Suitable energy density of the laser light irradiated at this time is in a range of about $100\times10^3$ W/cm$^2$ to $500\times10^3$ W/cm$^2$, however, the optimum value varies depending on scanning speed of the laser light, thickness of the silicon film, whether the silicon film is amorphous or polycrystalline, and so forth. In the case of using a laser oscillator with output at 10 W, since the width of a region that can be annealed by one scanning is 500 µm, it is necessary to execute one way scanning 8 times or reciprocative scanning 4 times in order to implement annealing of a required width (4 mm). The width of the region that can be annealed is dependent on the output of the laser oscillator 6, so that if the output of the laser oscillator 6 is sufficiently large, it is possible to irradiate a larger region, thereby reducing scanning times. Or it is also possible to render an irradiating laser beam in a shape smaller in condensed light width or greater in the longitudinal direction.

Figure 17:
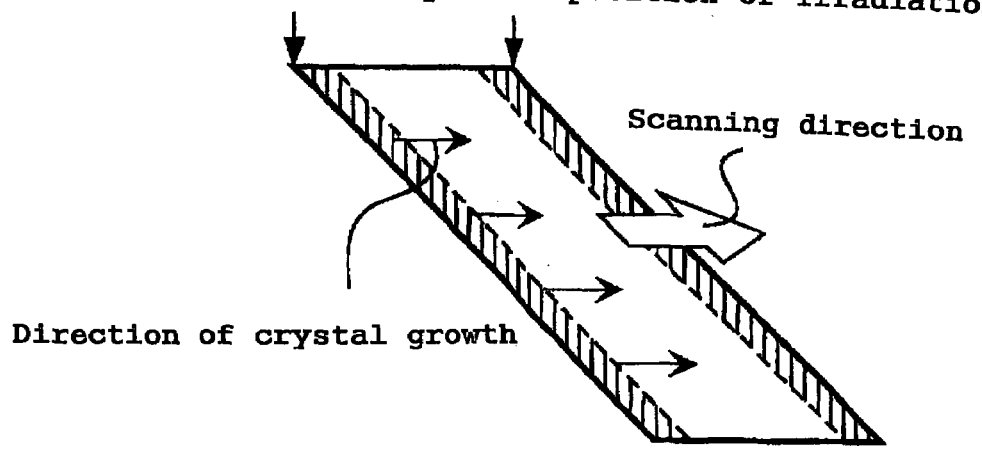
FIG. 17 is a perspective view for illustrating a laser irradiation region at the time of the laser annealing according to the invention.

FIG. 17 is a perspective view for illustrating a laser irradiation region at the time of the laser annealing according to the invention. While relatively shifting the glass substrate 1 at a speed of 500 mm/s, the glass substrate 1 is irradiated up to a length 100 µm only at pitches of 250 µm in a manner shown in FIG. 17. That is, irradiation with the laser light is started at an irradiation start position, and the stage 2 is relatively shifted 100 µm while maintaining the irradiation with the laser light, stopping the irradiation with the laser light at an irradiation completion position.

Subsequently, at a spot where the stage 2 is shifted 250 µm, irradiation start and irradiation termination are again executed, which is repeated as many times as necessary. By so doing, there is formed an annealing region approximately 500 µm×100 µm (in a stricter sense, an annealing region 500 µm×110 µm if the width of the irradiating laser light is taken into account) at the pitches of 250 µm, and as explained in detail later, grain growth occurs in the direction of scanning with the laser light.

FIG. 7 is a time chart for illustrating the embodiment of the process of fabricating the display device, according to the invention, showing timing of shifting the stage 2 and irradiating the laser light, respectively. The controller 22 is provided with counters C1 through C4 (not shown). Herein, there is described a procedure for irradiating the laser light 18 while relatively scanning the glass substrate 1 after turning the same ON/OFF with the EO modulator 10.

By scanning in the X-direction as indicated by the arrow in FIG. 6, the laser light 18 is irradiated to 1024 spots for a distance of 100 µm only at the pitches of 250 µm. Every time the stage 2 is shifted for a predetermined distance in the X-direction, the linear scale (the linear encoder) 3 securely attached to the x-axis of the stage 2 generates one pulse of pulse signal. If the signal generated is a sinusoidal wave, the same may be converted into a rectangular wave for use. By counting the pulse signal, a position of the stage 2 can be detected. In the case of the linear scale 3 with high precision, one pulse of the pulse signal is generated by the linear scale 3, for example, for every 0.1 µm in shift amount. In case a pulse interval is large, the pulse interval can be rendered into smaller intervals through electrical division.

The stage 2 requires a given distance (an acceleration region) to reach a given speed from a stop condition. Assuming that a stage speed at the time of laser irradiation is 500 mm/s, the acceleration region on the order of 50 mm is necessary, and positioning of the stage 2 is made at a position (at Xs in FIG. 7) not less than 50 mm, as the acceleration region, for example, 60 mm, to the left from the irradiation start position (the left edge of the annealing region 104 in FIG. 6) before stopping.

At this point in time, a counter circuit C1 (the counter C1) for counting the pulse signal from the linear scale 3 according to a command of the controller 22 starts counting after clearing counter numbers once and concurrently, starts driving the stage 2. The counter circuit C1 counts the pulse signal generated following a shift of the stage 2, and sends out a gate-ON signal (gate ON) at a point in time when the stage 2 has reached the first irradiation start position X1, that is, pulse numbers n1 (600000 pulses) correspond to a shift of 60 mm are counted. The gate-ON signal opens a gate to the power source 21 of the EO modulator 10, enabling the signal to be transmitted thereto. By this point in time, the stage speed has completed acceleration, having reached the given speed.

Upon receiving the gate-ON signal, a counter circuit C3 (the counter C3) sends out an ON signal (EOM-ON) for the power source 21 of the EO modulator, and concurrently, starts counting after clearing count numbers, thereafter sending out the ON signal to the power source 21 of the EO modulator every time when pulse numbers n3 (2500 pulses) corresponding to a pitch of irradiation are counted. Meanwhile, a timer T1 (timer 1) (not shown) incorporated in the controller 22.

Meanwhile, upon receiving the ON signal to the power source 21 of the EO modulator, a counter circuit C4 (the counter C4) starts counting while clearing count numbers, and sends out an OFF signal (EOM-OFF) to the power source 21 of the EO modulator at a point in time when pulse numbers n4 (1000 pulses) corresponding to the length 100 μm of the annealing region are counted. This operation is repeated every time when the counter circuit C3 sends out the ON signal for the power source 21 of the EO modulator.

During a time period from receipt of the ON signal for the power source 21 of the EO modulator until receipt of the OFF signal for the power source 21 of the EO modulator (time required for the stage 2 to pass over a distance of 100 μm at the stage speed of 500 mm/s), the power source 21 of the EO modulator applies a voltage for causing the polarization direction of the laser light 18 to be rotated by 90 degrees to the Pockels cell 61. As a result, the laser light 18 passes though the EO modulator 10 to be irradiated to the substrate 1 only for time corresponding to time when the voltage is applied to the Pockels cell 61.

Meanwhile, upon receiving the gate-ON signal from the counter circuit C1, a counter circuit C2 (the counter C2) clears count numbers, counts the OFF signals for the power source 21 of the EO modulator, send out by the counter circuit C4, and closes the gate at a point in time when pulse numbers n2 (1024 pulses) corresponding to the number of the annealing regions are counted. As a result, the power source 21 of the EO modulator no longer receives the ON signal for the power source 21 of the EO modulator, and the OFF signals for the power source 21 of the EO modulator, so that the power source 21 of the EO modulator stops its operation.

In accordance with the procedure described above, the first laser annealing for the driver circuit region 102 shown in FIG. 6 is completed, however, since the driver circuit region, in practice, is several mm in width, the glass substrate 1 in whole cannot be annealed with one scanning. Accordingly, after shifting the glass substrate 1 in the Y-direction by a given pitch (with the present embodiment, 500 μm), the above-described procedure is repeated. By so doing, in a state where the stage 2 is continuously shifted, the laser light 18 can be irradiated with high precision without being affected in any way by variation in the stage speed. However, when scanning is repeated, there are cases where annealed portions are overlapped in parallel with a scanning direction or portions not irradiated with the laser light 18 occur. Because grain growth is disturbed in those portions, it is desirable to consider a layout design such that no transistor is formed in portions where scanned parts are overlapped with each other.

Now, behavior of a polycrystalline silicon thin film upon irradiation thereof with the laser light 18 is described hereinafter.

As previously described, with the present embodiment, the glass substrate 1 obtained by forming the polycrystalline silicon thin film on the top surface of the glass substrate by the excimer laser annealing (that is, reformation) is used as the object for annealing.

Figure 8:
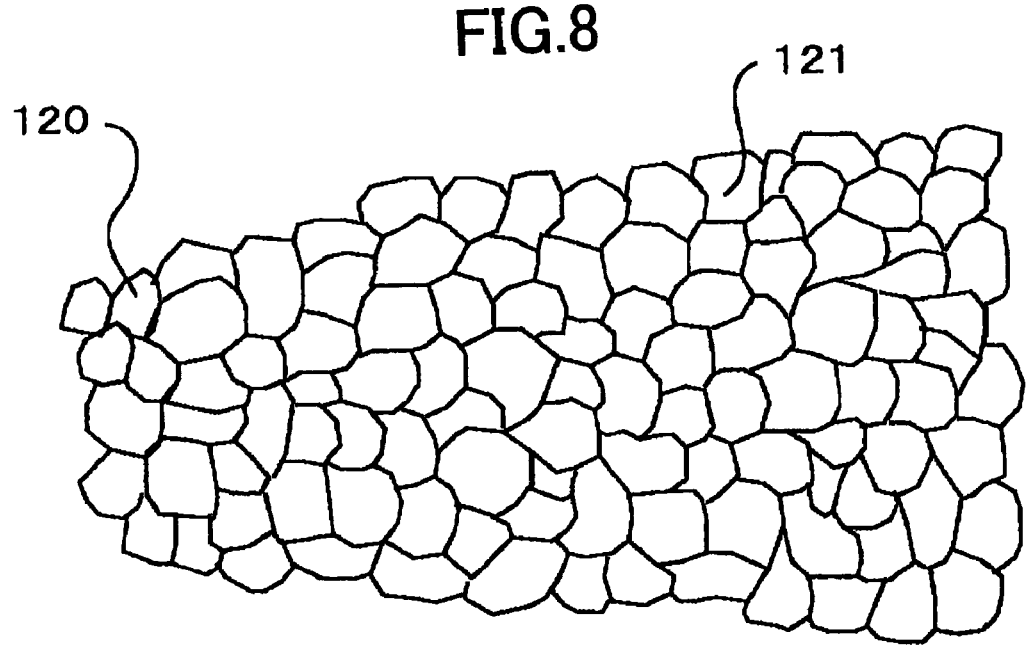
FIG. 8 is a plan view showing crystal morphology prior to the laser annealing according to the embodiment of the process of fabricating the display device according to the invention.
Figure 9:
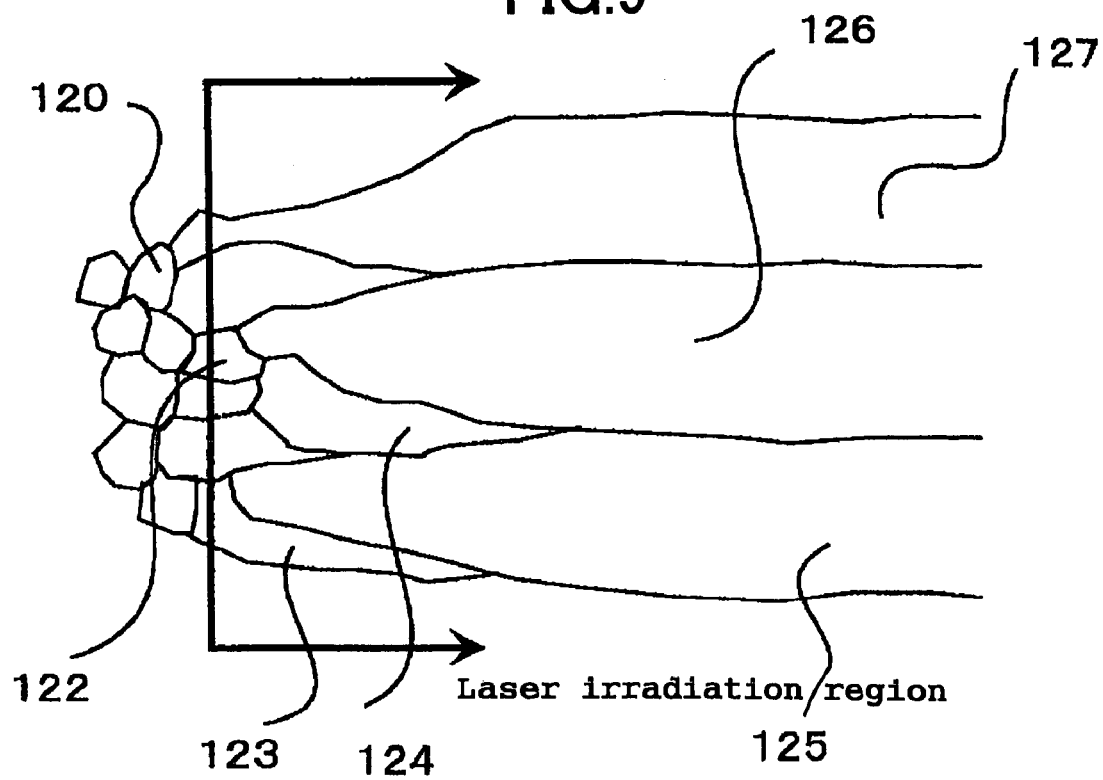
FIG. 9 is a plan view showing crystal morphology after the laser annealing.
Figure 10:
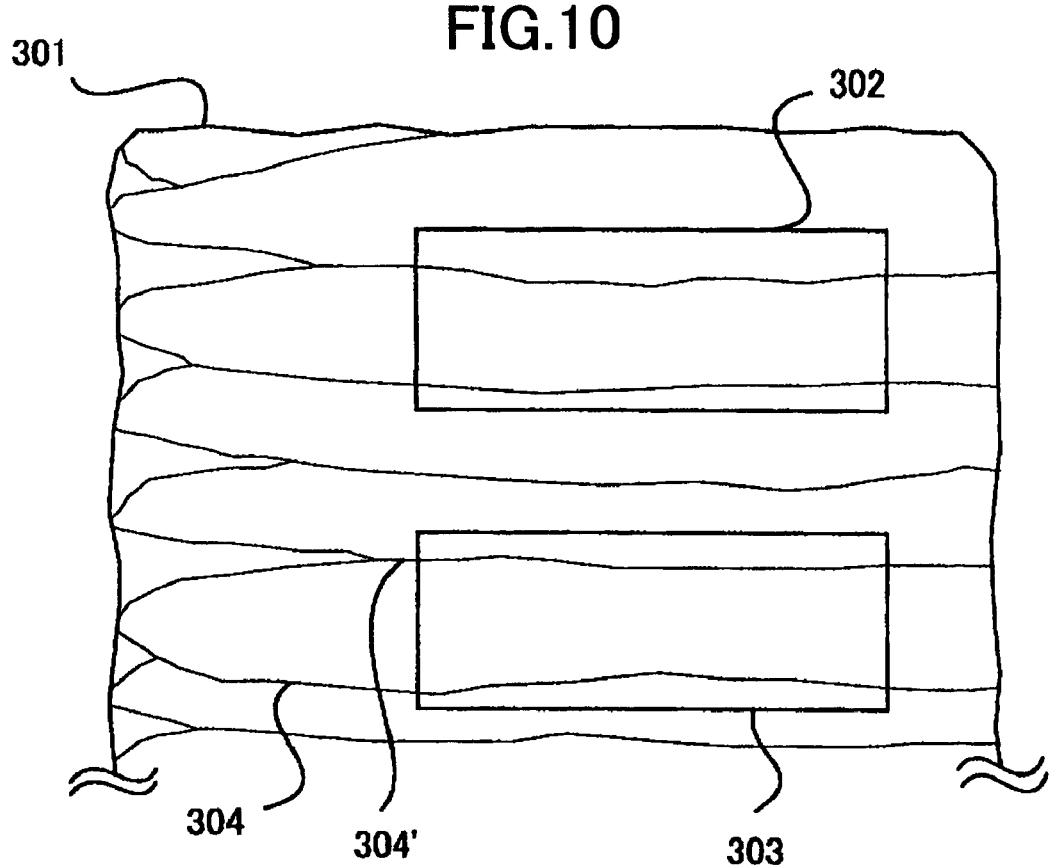
FIG. 10 is a plan view of the glass substrate 1, showing a relationship in position between regions where the laser annealing is applied and active regions of the driver circuit.

FIG. 8 is a plan view showing crystal morphology prior to the laser annealing according to the embodiment of the process of fabricating the display device according to the invention, FIG. 9 is a plan view showing crystal morphology after the laser annealing, and FIG. 10 is a plan view of the glass substrate 1, showing a relationship in position between regions where the laser annealing is applied and active regions of the driver circuit. The polycrystalline silicon thin film obtained by the excimer laser annealing is an aggregate of fine crystal grains 120, 121, not more than 1 μm (several 100 nm) in grain size as shown in FIG. 8. Upon irradiation of regions shown in the figure with the laser light, the fine crystal grains 120 outside of laser irradiation regions are left intact, however, fine crystal grains (for example, the crystal grains 121) within the laser irradiation regions melt. Thereafter, with passage of each of the laser irradiation regions, the crystal grains 121 are rapidly solidified and recrystallized.

Hereupon, melted silicon uses crystal grains remaining on the periphery of melted parts as seed crystals, and crystals following the crystal orientation of the seed crystals undergo growth in the scanning direction of the laser light in accordance with temperature gradient. At this point in time, since a growth rate of crystal grains varies depending on the crystal orientation, only the crystal grains having the crystal orientation with the fastest growth rate eventually continue crystal growth.

More specifically, as shown in FIG. 9, growth of a crystal grain 122 having the crystal orientation with a slow growth rate is suppressed by growth of crystal grains 124, 126, surrounding the crystal grain 122, having the crystal orientation with a faster growth rate, respectively, so that crystal growth thereof stops. Further, a crystal grain 123 and the crystal grain 124, having the crystal orientation with an intermediate growth rate, respectively, continue growth, however, growth thereof is suppressed by growth of crystal grains 125, 126, having the crystal orientation with a still faster growth rate, respectively, so that crystal growth thereof stops before long. Eventually only the crystal grains 125, 126, and a crystal grain 127, having the crystal orientation with the fastest growth rate, respectively, continue growth. These crystal grains 125, 126, 127, continuing crystal growth until the last are individual crystal grains in a strict sense, but have nearly the same crystal orientation, so that a melted and recrystallized part can be effectively regarded as a single crystal.

By irradiating the laser light to the polycrystalline silicon thin film as described hereinbefore, only portions irradiated with the laser light are annealed in the shape of islands, and only crystal grains having a specific crystal orientation undergo growth, thereby forming regions of the crystal grains 125, 126, 127, having properties substantially similar to those of a single crystal, although in polycrystalline state in a strict sense. These regions can be effectively regarded as a single crystal particularly in the direction not crossing the grain boundaries, that is, in the scanning direction of the laser light. With the present invention, the silicon film crystallized in this way is called a band-like polycrystalline silicon film.

By repeating the procedure described while relatively scanning the gals substrate 1, and by sequentially irradiating portions requiring annealing with the laser light, all the thin-film transistor (thin-film transistor of the driver part) forming regions of the driver circuit can be converted into regions of the band-like polycrystalline silicon film having properties similar to those of the single crystal. Further, because in the regions having properties similar to those of the single crystal, the growth of the crystal grains has taken place in a given direction as shown in FIG. 9, it is possible to cause a direction of current flow to coincide with a direction of grain growth when forming the transistors, thereby preventing current from flowing in such a direction as to cross grain boundaries.

Figure 11:
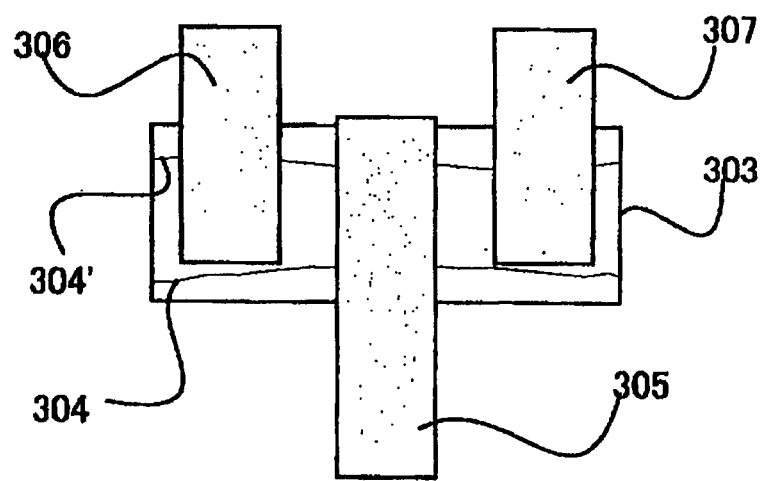
FIG. 11 is a plan view of a substrate, showing a configuration of the thin-film transistors of the driver part formed by the laser annealing according to the invention.

FIG. 11 is a plan view of a substrate, showing a configuration of the thin-film transistors of the driver part formed by the laser annealing according to the invention. That is, alignment can be made such that portions of a laser irradiation region 301, made up of the crystal grains having a high growth rate, respectively, correspond to active layers (or active regions) 302, 303 of the thin film transistors of the driver circuit, respectively, as shown in FIG. 10. After impurities implantation process and photo-etching process, regions other than the active regions 302, 303 are removed, and there are formed a gate electrode 305 through the intermediary of a gate insulating film, a source electrode 306 and a drain electrode 307, having ohmic connection, thereby completing a thin-film transistor. In this case, grain boundaries 304, 304' exist in the active region 303, but since current flows between the source electrode 306 and the drain electrode 307, the current does not flow across the grain boundaries 304, 304', so that mobility equivalent to that in the case where the active region is effectively made of a single crystal can be obtained.

As described above, in the part melted and reacrystallized by the laser annealing according to the invention, by causing the direction of current flow to coincide with the direction of crystal grain boundaries so as not to allow current to flow in such a direction as to cross the grain boundaries, mobility can be improved more than twice as compared with a case where annealing with the excimer laser is simply applied, more specifically, to more than 350 $cm^2/Vs$. Such a mobility value is sufficient to constitute a driver circuit capable of driving liquid crystals at a high speed.

Meanwhile, transistors for switching the pixel part (thin-film transistors of the pixel part) are formed in the region 101 of polycrystalline silicon film, where annealing with the excimer laser is simply applied. With a polycrystalline film obtained by the annealing with the excimer laser, crystal grains are fine, and the crystal orientations thereof are at random, so that mobility is small as compared with the case of the crystal grains obtained by the excimer laser annealing according to the invention, however, such mobility is good enough for the thin-film transistors for switching the pixel part, that is, the thin-film transistors of the pixel part.

In some cases, even an amorphous silicon film can be sufficient for use in the thin-film transistors of the pixel part. In such a case, an amorphous silicon thin film is formed on top of the glass substrate 1, and it is sufficient that the excimer laser annealing according to the invention is not applied thereto while the excimer laser annealing according to the invention is applied to the driver circuit parts only. Silicon initially melted by irradiation with the laser light 18 is turned into fine polycrystalline state in the course of solidification thereof, and crystal grains formed in this stage serve as seed grains, whereupon growth of crystal grains having various crystal orientations takes place, however, as with the case where the silicon film in polycrystalline state, formed by the excimer laser annealing, is irradiated with the laser light 18, only crystal grains having crystal orientations with the fastest growth rate eventually continue crystal growth, thereby forming a polycrystalline silicon thin film regarded effectively as a single crystal.

After completion of the laser annealing applied to the driver circuit region 102 shown in FIG. 6, the driver circuit region 102' needs annealing. In this case, the glass substrate 1 may be rotated by 90 degrees or a scanning direction may be altered by 90 degrees. In the latter case, it is necessary to rotate a beam-forming device (in FIG. 1, the cylindrical lens 11) by 90 degrees and to switch over between the transverse direction and the longitudinal direction of the rectangular slit. Further, the driver circuit region 102 shown in FIG. 6 is normally a data driver circuit region (referred to as a drain driver when thin-film transistors are used as the active elements) and the driver circuit region 102' shown in FIG. 6 is a scanning driver circuit region (referred to as a gate driver when thin-film transistors are used as the active elements).

In the case of the glass substrate 1 shown in FIG. 6, if transistors requiring fast operation can be put together in either of the driver circuit regions 102, 103, for example, in the driver circuit region 102, the laser annealing according to the invention may be applied to the driver circuit region 102 only. In other words, the active layers (active regions) of the transistors formed in the driver circuit region 102 are made of polycrystalline silicon containing crystal grains having no grain boundaries in the direction of current flow, so that fast operable transistors can be obtained.

On the other hand, since thin-film transistors not requiring so fast operation are formed in the driver circuit region 102', the active layers (active regions) of the transistors are made up of a polycrystalline silicon film composed of fine crystal grains, simply annealed by the excimer laser. In this case, since it becomes unnecessary to rotate the substrate or the scanning direction and the direction of the linear beam, and in addition, regions to be annealed can be reduced, the effect of improvement in throughput is large.

Figure 18:
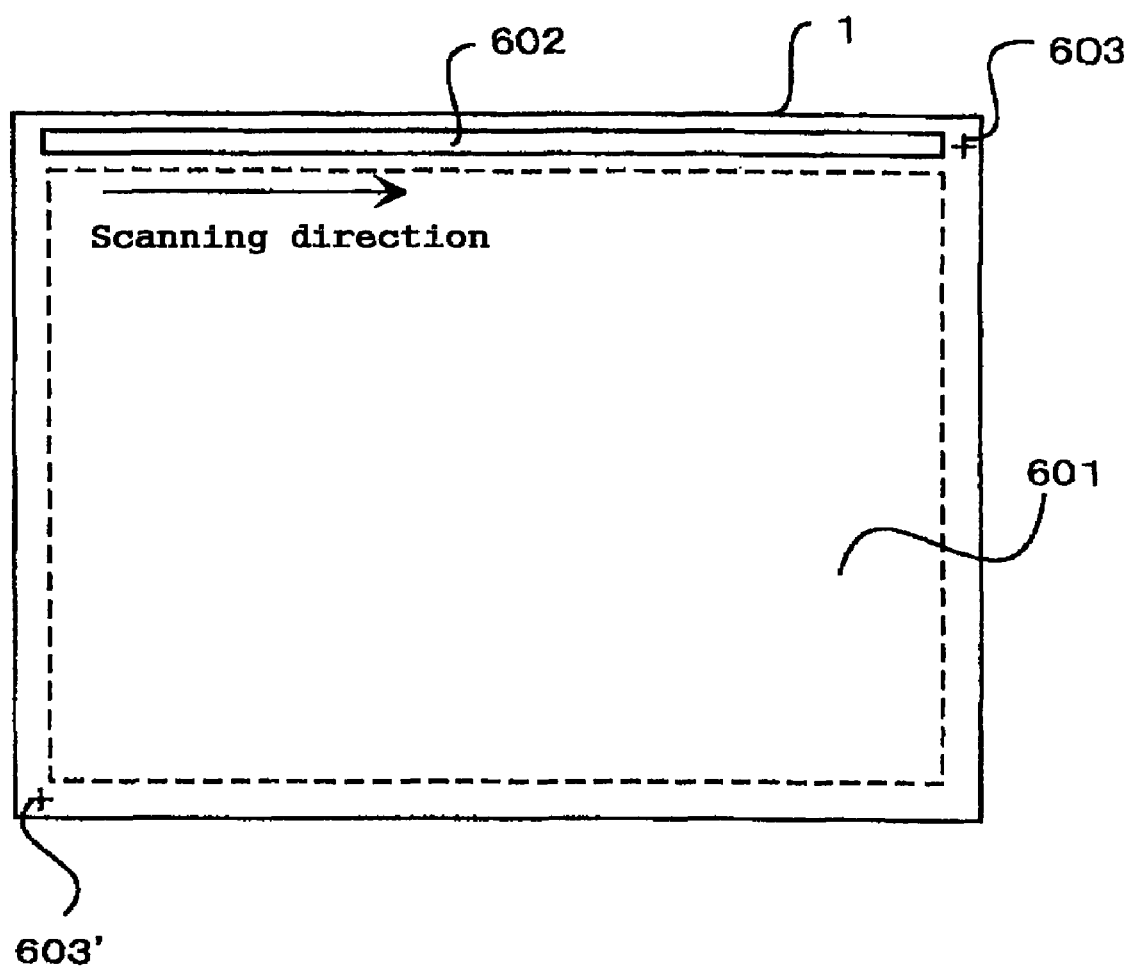
FIG. 18 is a plan view of an insulating substrate for illustrating another embodiment of a process of fabricating the display device, according to the invention.

FIG. 18 is a plan view of an insulating substrate for illustrating another embodiment of a process of fabricating the display device, according to the invention. With the present embodiment, driver circuit regions as objects for the laser annealing are put together on one side of an insulating substrate (glass substrate). As shown in FIG. 18, if a driver circuit region 602 formed on top of a glass substrate 1 can be put together on one side thereof, outside of a pixel region 601, active layers (active regions) of all thin-film transistors of a driver part are made up of a polycrystalline silicon film containing crystal grains having no grain boundaries in the direction of current flow, so that fast operable transistors can be obtained. In addition, it becomes unnecessary to rotate the substrate or a scanning direction and the direction of a linear beam, so that such a configuration is preferable from the viewpoint of improvement in throughput. However, a plurality of alignment marks, for example, alignment marks 603, 603', shown in the figure, are evidently required.

Further, with reference to the embodiment previously described, it has been described that the signals from the linear scales (linear encoders) installed in the stage 2 are counted for detecting the position or shift amount of the stage 2. However, the invention is not limited thereto, and use may be made of output signals from a measuring machine using laser light interference, a rotary encoder installed on the axis of a motor driving the stage, and so forth. A process of fabricating a thin-film transistor substrate (an active matrix substrate) including the above-described procedure for reformation of the band-like polycrystalline silicon film according to the invention can be summed up in respective flowcharts in FIGS. 22 and 23.

Figure 22:
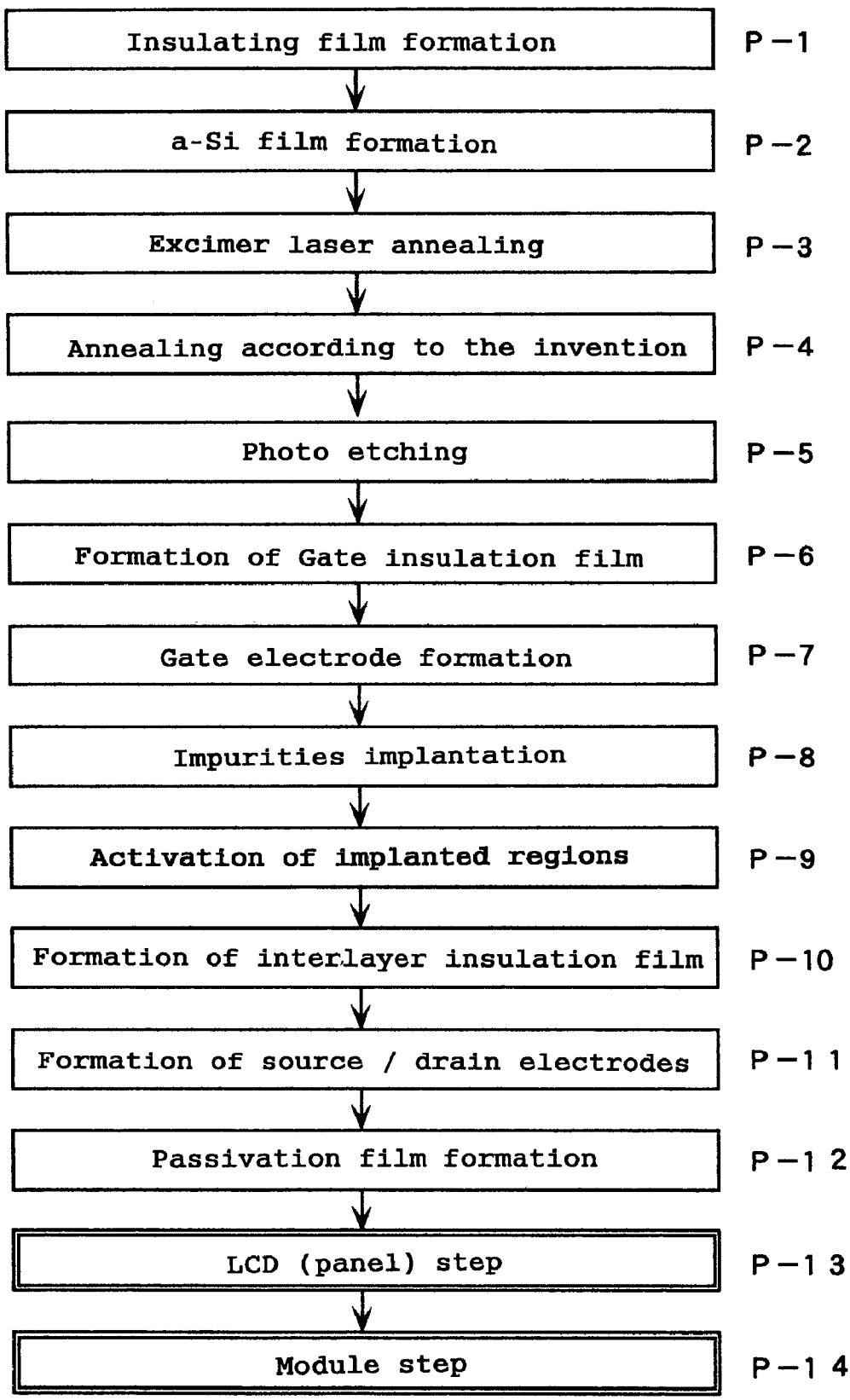
FIG. 22 is a flowchart for illustrating the steps of fabricating a display device, to which the process of fabrication according to the invention is applied.
Figure 23:
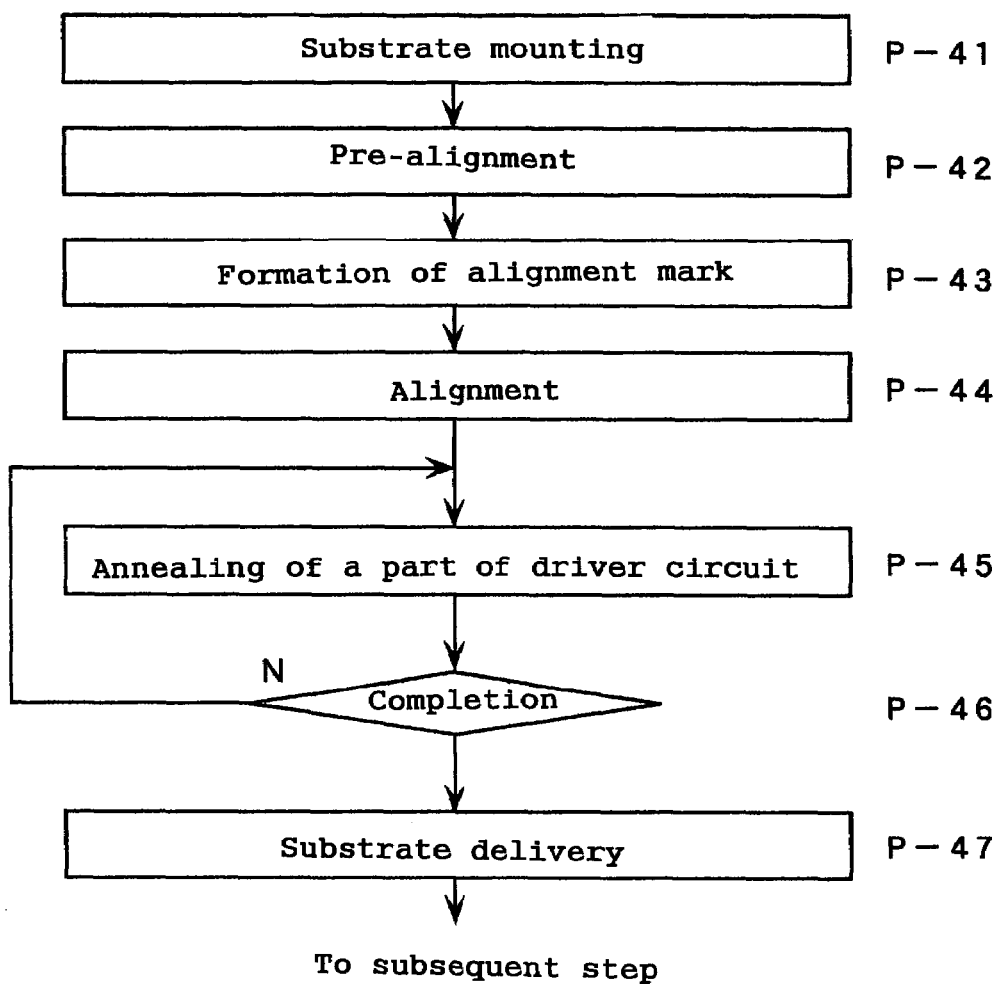
FIG. 23 is a flowchart for illustrating the step of annealing according to the invention.

FIG. 22 is a flowchart for illustrating the steps of fabricating a display device, to which the process of fabrication according to the invention is applied. In this case, the steps of fabricating a liquid crystal display device are described by way of example. FIG. 23 is a flowchart for illustrating the step of annealing according to the invention. The respective steps are indicated by reference numerals P-XX. As shown in FIG. 22, an insulating film is formed on top of a substrate (P-1), an a-Si (amorphous silicon) film is formed (P-2), and excimer laser annealing is applied (P-3) before applying laser annealing according to the invention (P-4) only to active layer part of respective transistors making up a driver circuit, and the periphery thereof. Details of a process of the laser annealing according to the invention (P-4) are shown in FIG. 23.

In FIG. 23, the substrate (glass substrate) with the excimer laser annealing applied thereto (P-3) is mounted on the stage 2 of a fabrication apparatus (laser annealing apparatus) according to the invention, described with reference to FIG. 1 (P-41), pre-alignment is executed in edge faces or corners of the substrate (P-42), and alignment marks are formed by laser beam machining (P-43). After execution of alignment (fine alignment) by detecting the alignment marks (P-44), laser annealing is applied in accordance with design data only to the active layer part of the respective transistors making up the driver circuit, and the periphery thereof (P-45). If the alignment marks have already been formed by other means such as a photo resist process and so forth at the time of mounting the substrate on the laser annealing apparatus, there is no need for the steps of executing the pre-alignment (P-42), and forming the alignment marks (P-43). After repeating the laser annealing until all intended regions are annealed (P-46), the substrate is transported (P-47).

Thereafter, as shown in FIG. 22, in the step pf photo-etching (P-5), only necessary portions of a polycrystalline silicon film are left intact in the shape of islands on the basis of the alignment marks 103, 103' or coordinates of an origin point as calculated from the alignment marks 103, 103'. Subsequently, after a photo-resist process comprising the step of gate insulating film formation (P-6), and the step of gate electrode formation (P-7), there are executed the steps of impurities implantation (P-8), and activation of implanted regions (P-9), respectively. Thereafter, after a further photo-resist process comprising the steps of interlayer insulator formation (P-10), source electrode and drain electrode formation (P-11), and passivation film formation (P-12), there are formed the driver circuit and the pixel part 101, thereby completing a TFT substrate (LCD (panel) step) (P-13). The alignment marks 103, 103' are used for alignment in at lest one photo-resist process after the laser annealing according to the invention. Thereafter, alignment marks newly formed by the photo-resist process described as above may be used. The thin-film transistors in FIG. 11 are shown merely by way of example, and the invention is not limited thereto. It is obvious that thin-film transistors can have various constructions, and the thin-film transistors of the invention may be formed in such a manner as to have constructions without departing from the spirit and scope of the invention.

Meanwhile, the transistors for switching the pixel part (the thin-film transistors of the pixel part) are formed in the region 101 of polycrystalline silicon film, where the annealing with the excimer laser is simply applied. That is, after a photo-resist process executed for gate insulating film formation, gate electrode formation, impurities implantation, activation of implanted regions, source electrode and drain electrode formation, passivation film formation, and so forth, on the basis of the alignment marks 103, 103' or coordinates of an origin point as calculated from the alignment marks 103, 103', there is completed a TFT substrate.

Subsequently, after executing the LCD (panel) step of forming an alignment layer on the TFT substrate as completed, overlaying color filters on top of the TFT substrate after a rubbing step, and sealing in liquid crystal material, and a module step (P-14) of assembling together with a backlight, there is completed a liquid crystal display device (so-called system on panel) with a high-speed driver circuit formed on the glass substrate thereof.

With the above-described embodiment of the invention, it has been described that the polycrystalline silicon thin film formed by the excimer laser annealing, composed of fine crystal grains, is used as the object for the laser annealing according to the invention. When a polycrystalline silicon thin film is formed directly on the substrate, polycrystalline silicon (Poly-Si) film formation is substituted for non-crystalline, that is, amorphous silicon (a-Si) film formation in the flowchart shown in FIG. 22, so that the step of applying the excimer laser annealing can be omitted, still obtaining the same advantageous effect as that for the above-described embodiment.

FIG. 12 is a schematic representation for illustrating electronic equipment with the display device of the invention mounted therein. The display device of the invention can be mounted in a display part of a TV receiver 401 shown in FIG. 12A, a mobile phone 402 shown in FIG. 12B, or a notebook PC 403 shown in FIG. 12C. Other applications include a display of various instruments housed in a dashboard of a car, a display of a potable game device, a monitor display of a VTR or digital camera, and so on. Further, the display device of the invention can be used as a display device using an organic electro-luminescent display panel and other panel type display devices besides the liquid crystal display device using a liquid crystal display panel.

Figure 13:
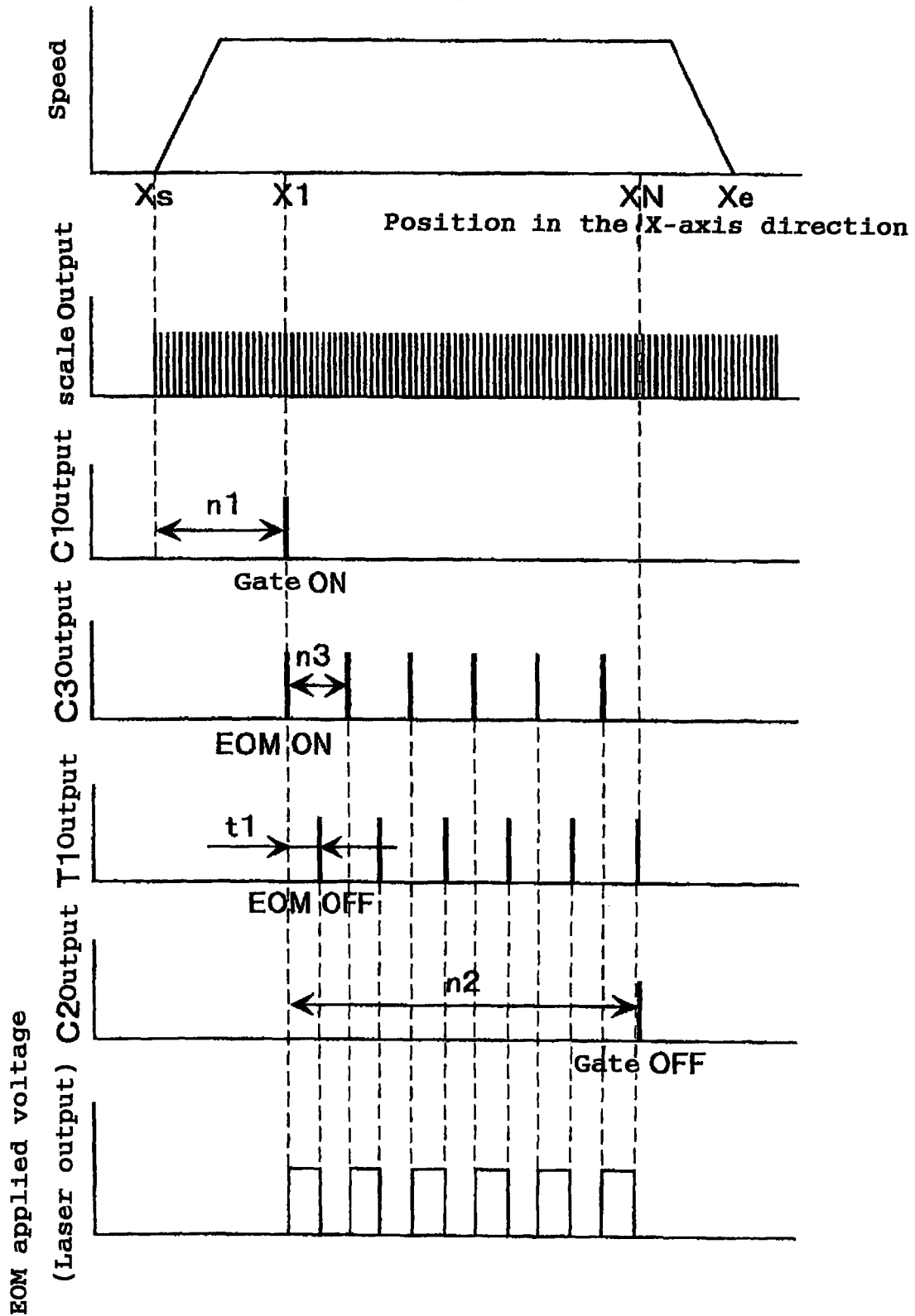
FIG. 13 is a time chart showing timing of shifting a stage and irradiating laser light, respectively, with reference to a laser annealing method, which is said embodiment of the process of fabricating the display device according to the invention.

Now, there is described hereinafter another embodiment of a process of fabricating the display device according to the invention. FIG. 13 is a time chart showing timing of shifting a stage and irradiating laser light, respectively, with reference to a laser annealing method, which is said embodiment of the process of fabricating the display device according to the invention. There is described an example where as with the case of the previously-described embodiment, while scanning in the X-direction indicated by the arrow in FIG. 6, laser light is irradiated to 1024 spots for a distance of 100 μm only at the pitches of 250 μm. The embodiment differs from the previously described embodiment in respect of a procedure for turning the laser light ON/OFF with an EO modulator while relatively scanning the substrate.

The linear scale 3 securely attached to the x-axis of the stage 2 in FIG. 1 generates a pulse signal at a given interval so as to correspond to a shift of the stage 2 in the X-direction. If the signal generated is a sinusoidal wave, the same may be converted into a rectangular wave for use. By counting the pulse signal, a position of the stage 2 can be detected. In the case of the linear scale 3 with high precision, one pulse of the pulse signal is generated by the linear scale 3, for example, for every 0.1 μm in shift amount. In case a pulse interval is large, the pulse interval can be rendered into smaller intervals through electrical division.

The stage 2 requires a given distance (an acceleration region) to reach a given speed from a stop condition. Assuming that a stage speed at the time of laser irradiation is 500 mm/s, the acceleration region on the order of 50 mm is necessary, and positioning of the stage 2 is made at a position (at Xs in FIG. 7) not less than 50 mm, as the acceleration region, for example, 60 mm, to the left from the irradiation start position (the left edge of the annealing region 104 in FIG. 6) before stopping.

At this point in time, a counter circuit C1 (the counter C1) for counting the pulse signal from the linear scale 3 according to a command of the controller 22 starts counting after clearing counter numbers once and concurrently, starts driving the stage 2. The counter circuit C1 counts the pulse signal generated following a shift of the stage 2, and sends out a gate-ON signal (gate ON) at a point in time when the stage 2 has reached the first irradiation start position X1, that is, pulse numbers n1 (600000 pulses) correspond to a shift of 60 mm are counted. The gate-ON signal opens a gate to the power source 21 of the EO modulator 10, enabling the signal to be transmitted thereto. By this point in time, the stage speed has completed acceleration, having reached the given speed.

Upon receiving the gate-ON signal (gate ON), a counter circuit C3 (the counter C3) sends out an ON signal (EOMON) for the power source 21 of the EO modulator, and concurrently, starts counting after clearing count numbers, thereafter sending out the ON signal to the power source 21 of the EO modulator every time when pulse numbers n3 (2500 pulses) corresponding to a pitch of irradiation are counted.

Meanwhile, upon receiving the ON signal of the power source 21 of the EO modulator, a timer T1 (not shown) (timer 1) incorporated in the controller 22 starts counting time, and sends out an OFF signal (EOMOFF) to the power source 21 of the EO modulator at a point in time, with the elapse of time (200 µs) required for shifting across an anneal distance of 100 µm. Otherwise, upon receiving the ON signal of the power source 21 of the EO modulator, a pulse signal having a pulse width corresponding to time (200 µs) required for shifting across an anneal distance of 100 µm may be generated. This operation is repeated every time the ON signal of the power source 21 of the EO modulator is received.

During a time period from receipt of the ON signal for the power source 21 of the EO modulator until receipt of the OFF signal for the power source 21 of the EO modulator (time required for the stage 2 to pass over a distance of 100 µm at the stage speed of 500 mm/s), the power source 21 of the EO modulator applies a voltage for causing the polarization direction of the laser light 18 to be rotated by 90 degrees to the Pockels cell 61. As a result, the laser light 18 passes though the EO modulator 10 to be irradiated to the substrate 1 only for time corresponding to time when the voltage is applied to the Pockels cell 61.

In this connection, for use as the power source 21 of the EO modulator, there is available another type capable of applying a voltage waveform corresponding to a pulse signal waveform by receiving a pulse signal from outside. In such a case, a pulse generator may be used in place of the timer T1. That is, the ON signal of the power source 21 of the EO modulator, generated every time the pulse numbers n3 (2500 pulses) corresponding to the pitch of irradiation are counted by the counter circuit C3 is delivered to the pulse generator to thereby generate a signal with a predetermined pulse width, that is, a pulse width corresponding to time required for the laser light passing through the annealing region (in the case of the present embodiment, the pulse width: 200 µs), and the signal is delivered to the power source 21 of the EO modulator. By so doing, as with the above-described embodiment, the laser light can be irradiated to necessary regions on the substrate 1.

Meanwhile, upon receiving the gate-ON signal from the counter circuit C1, a counter circuit C2 (the counter C2) clears count numbers, counts the OFF signals for the power source 21 of the EO modulator, sent out by the counter circuit C4, or output pulses of the pulse generator, and closes the gate at a point in time when pulse numbers n2 (1024 pulses) corresponding to the number of the annealing regions are counted. As a result, the power source 21 of the EO modulator no longer receives the ON signal for the power source 21 of the EO modulator, and the OFF signals for the power source 21 of the EO modulator, so that the power source 21 of the EO modulator stops its operation.

With the present embodiment, the irradiation start position of the laser light is controlled by a position of the stage, however, the irradiation completion position of the laser light is regulated by time elapsed from the start of laser irradiation or a pulse width of the output pulse of the pulse generator. Accordingly, if there is variation in the stage speed, there is a possibility of slight variation of the irradiation completion position, corresponding to the variation in the stage speed. When the stage of relatively large mass is being shifted at a high speed, however, the variation in the stage speed is slight, and an effect due to the variation in the stage speed is effectively very small. In case the stage speed varies on the order of ±1%, there is no variation in the irradiation start position, and variation of the irradiation completion position is to the extent of about of 1 µm, so that no problem occurs in practice.

In accordance with the procedure described above, the first laser annealing for the driver circuit region 102 shown in FIG. 6 is completed, however, since the driver circuit region, in practice, is several mm in width, the glass substrate 1 in whole cannot be annealed with one scanning. Accordingly, after shifting the glass substrate 1 in the Y-direction by a given pitch (with the present embodiment, 500 µm), the above-described procedure is repeated. By so doing, in a state where the stage 2 is continuously shifted, the laser light 18 can be irradiated with high precision without being affected in any way by variation in the stage speed. However, when scanning is repeated, there are cases where annealed portions are overlapped in parallel with a scanning direction or portions not irradiated with the laser light 18 occur. Because grain growth is disturbed in those portions, it is desirable to consider a layout design such that no transistor is formed in portions where scanned parts are overlapped with each other. Further, a change occurring to the crystal grains of the polycrystalline silicon thin film upon irradiation thereof with the laser light 18 is as previously described.

As with the case of the previously described embodiment, if on the glass substrate 1 shown in FIG. 6, transistors requiring fast operation can be put together in either of the driver circuit regions 102, 103, for example, in the driver circuit region 102, the laser annealing according to the invention may be applied to the driver circuit region 102 only. In other words, the active layers (active regions) of the transistors formed in the driver circuit region 102 are made of polycrystalline silicon containing crystal grains having no grain boundaries in the direction of current flow, so that fast operable transistors can be obtained. On the other hand, since thin-film transistors not requiring so fast operation are formed in the driver circuit region 102', the active layers (active regions) of the transistors are made up of a polycrystalline silicon film composed of fine crystal grains, simply annealed by the excimer laser. In this case, since it becomes unnecessary to rotate the substrate or the scanning direction and the direction of the linear beam, and in addition, regions to be annealed can be reduced, the effect of improvement in throughput is large.

Or as shown in FIG. 18, if a driver circuit region 602 formed on top of the glass substrate 1 can be put together on one side thereof, outside of a pixel region 601, active layers (active regions) of all thin-film transistors of the driver circuit are made up of a polycrystalline silicon film containing crystal grains having no grain boundaries in the direction of current flow, so that fast operable transistors can be obtained. In this case as well, it becomes unnecessary to rotate the substrate or a scanning direction and the direction of a linear beam, so that such a configuration is preferable from the viewpoint of improvement in throughput. However, a plurality of alignment marks, for example, alignment marks 603, 603', shown in the figure, are evidently required.

Further, with reference to the embodiment previously described, it has been described that the signals from the linear scales (linear encoders) installed in the stage 2 are counted for detecting the position or a shift amount of the stage 2. However, the invention is not limited thereto, and use may be made of output signals from a measuring machine using laser light interference, a rotary encoder installed on the axis of a motor driving the stage, and so forth.

Now, there is described hereinafter still another embodiment of a process of fabricating a display device according to the invention. In the previously described embodiment, there has been shown a case where the annealing regions each approximately 500 µm×100 µm are juxtaposed at the pitches of 250 µm. Herein, another case where the annealing regions are juxtaposed at closer pitches is described.

Assuming a case of annealing a region 4 mm in width by scanning with laser beam 500 µm×10 µm by way of example, an annealing width by one scanning is preferably increased as much as possible within a permissible range of laser output, and an annealing length (a size of an annealing region, in the scanning direction) and a pitch of the annealing region are preferably an integral multiple of a pixel pitch, respectively. In this case, assuming that a pixel pitch is 250 µm, one annealing region is set to 500 µm×500 µm.

Figure 28:
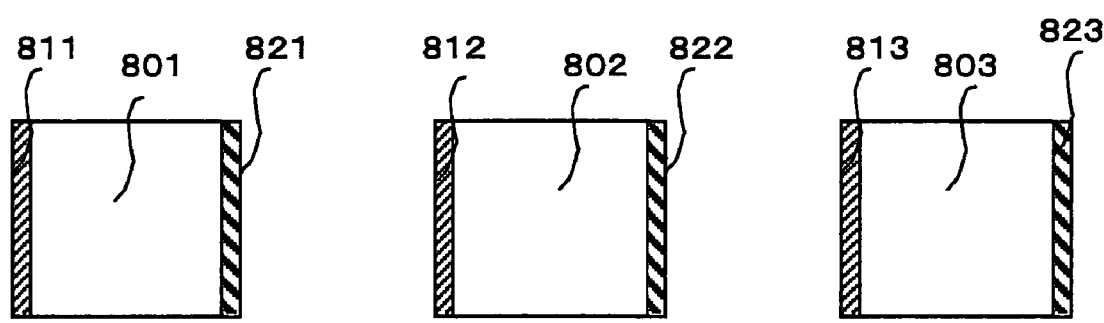
FIG. 28 is a plan view showing a state of annealing region at a first scanning according to the invention.

First, regions each 500 µm×500 µm in size are irradiated at pitches of 1 mm by a first scanning. In this case, as shown in FIG. 28, the respective regions 500 µm×500 µm are irradiated with laser light, and annealed regions are formed at the pitches of 1 mm. In the respective annealed regions 801, 802, 803, there occurs a decrease of film thickness in regions 811, 812, 813, about 10 µm wide, respectively, of an anneal start part, due to melted silicon being pulled in the scanning direction by interfacial tension. In respective regions 821, 822, 823, about 10 µm wide, of an anneal termination part, a swell (protrusion) is formed The respective annealed regions 801, 802, 803, sandwiched between those regions, are well annealed, forming a pseudo-single crystal film, respectively.

Figure 29:
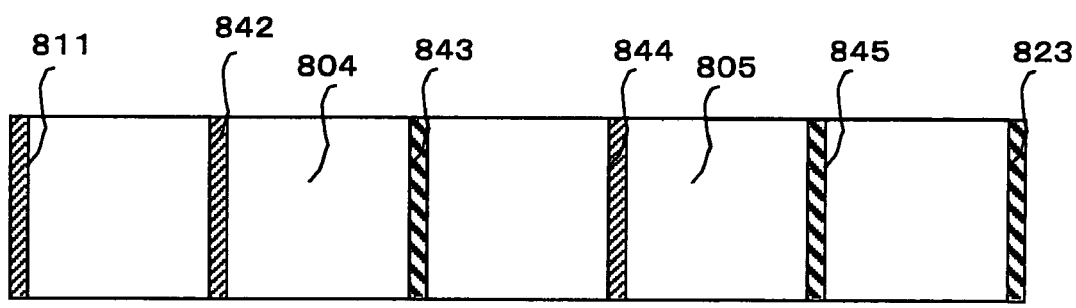
FIG. 29 is a plan view showing a state of annealing region at a second scanning according to the invention.

Subsequently, by executing annealing at pitches of 1 mm after shifting an irradiation start position by 500 µm in the scanning direction while keeping an irradiation region set at 500 µm×500 µm as above, regions 804, 805, not annealed at the time the precious scanning, are annealed, thereby forming respective annealed regions 500 µm wide as shown in FIG. 29. However, as previously described, since film thickness is decreased or a swell is formed in an irradiation start part and irradiation termination part, respectively, regions unsuitable for formation of transistors 811, 842, 843, 844, 845, 823, about 10 µm wide, respectively, are formed at pitches of 500 µm.

Now, dwelling on the region 842, it can be said that this part corresponds to an anneal termination part at the first scanning and a protrusion is formed therein, but at the second scanning, this part corresponds to an anneal start part, so that the protrusion is substantially eliminated, but is still unsuitable for formation of transistors in contrast with a normal region, for example, 801. Further, dwelling on the region 843, this part corresponds to an anneal start part at the first scanning, and film thickness decreases, but this part corresponds to an anneal termination part at the second scanning and a protrusion is formed therein, so that this part is unsuitable for formation of transistors.

Next, similar annealing is executed by shifting 500 µm in the direction normal to the scanning direction, which is repeated until an entire width requiring annealing is annealed. With the present embodiment, a width 4 mm is to be annealed, scanning of 8 rows, that is, scanning is repeated 16 times.

Figure 30:
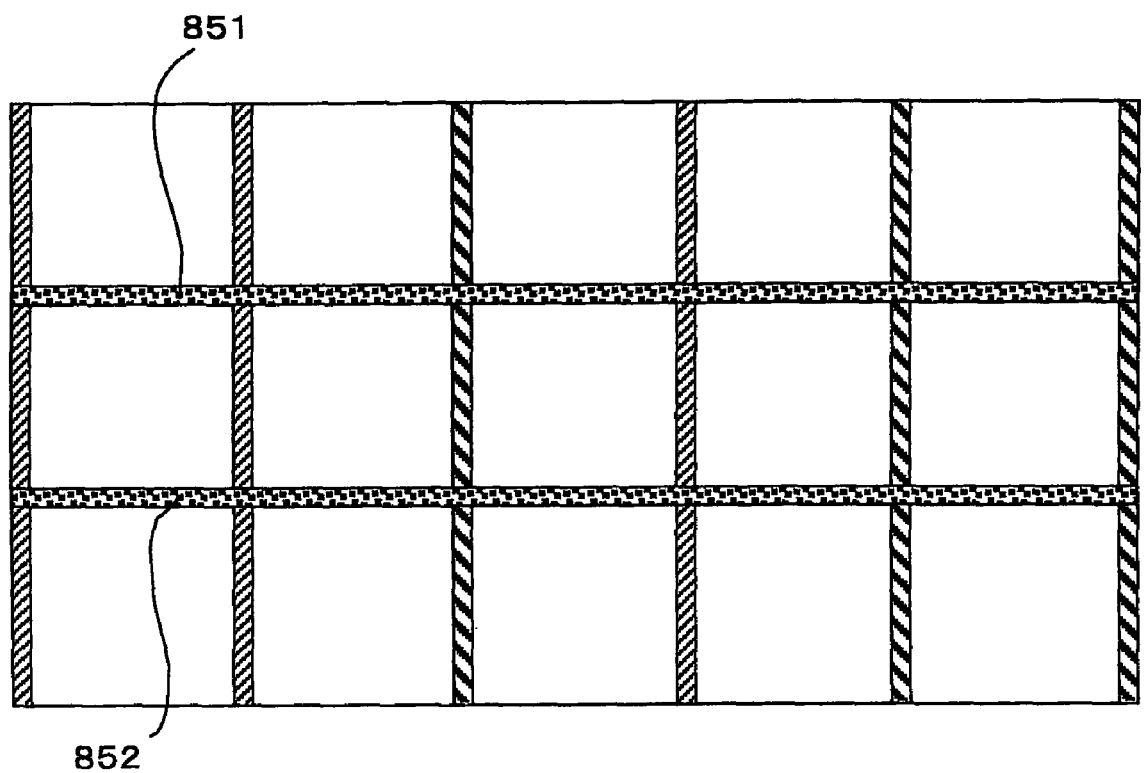
FIG. 30 is a plan view showing a state of annealing region upon completion of scanning according to the invention.

As shown in FIG. 30, when laser light is irradiated by shifting 500 µm in the direction normal to the scanning direction, in consequence of such operation, irradiation is duplicated, portions not irradiated are left out, or portions previously irradiated are subjected to thermal effects at the time of a successive irradiation, thereby disturbing crystal morphology, in overlapped parts 851, 852. Accordingly, there are left out the regions 851, 852, unsuitable for formation of transistors.

Figure 31:
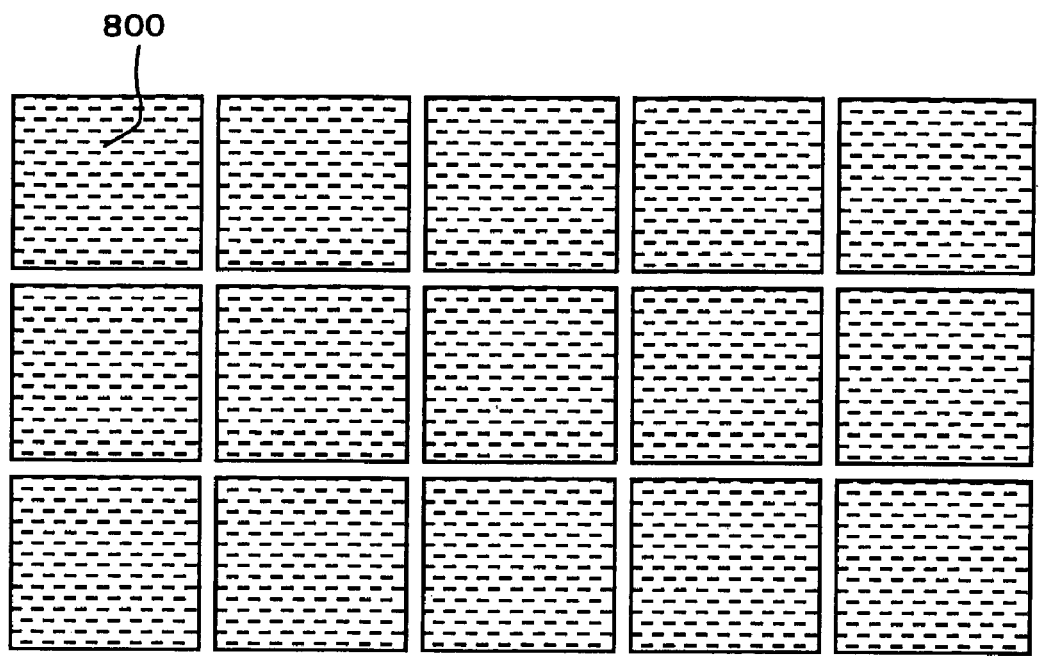
FIG. 31 is a plan view showing regions where transistor can be formed upon completion of annealing according to the invention.

Having taken those into consideration, it can be said that well annealed regions (that is, pseudo-single crystal regions) each 490 µm×490 µm are finally formed at pitches of 500 µm as shown FIG. 31. In the interests of simplicity, it can be said that pseudo-single crystal silicon films each 490 µm×490 µm are formed at pitches of 500 µm on the glass substrate in such a manner as tiles are stuck thereto. By designing such that a transistor can be disposed on the respective tiles of pseudo-single crystal silicon, high performance transistors can be formed.

Herein, there has been described a case where annealing is executed by scanning in the same direction, however, irradiation may be carried out by setting such that there is a shift of the irradiation position by 500 µm between scanning in one direction and scanning in the opposite direction in the case of reciprocative scanning. In this case, there will be a change in arrangement of parts with decreased film thickness and parts with a protrusion, as finally obtained, however, since any thereof is about 10 µm in width, and is unsuitable for formation of transistors, pseudo-single crystal regions suitable for formation of transistors will the same as those shown in FIG. 31.

Figure 35:
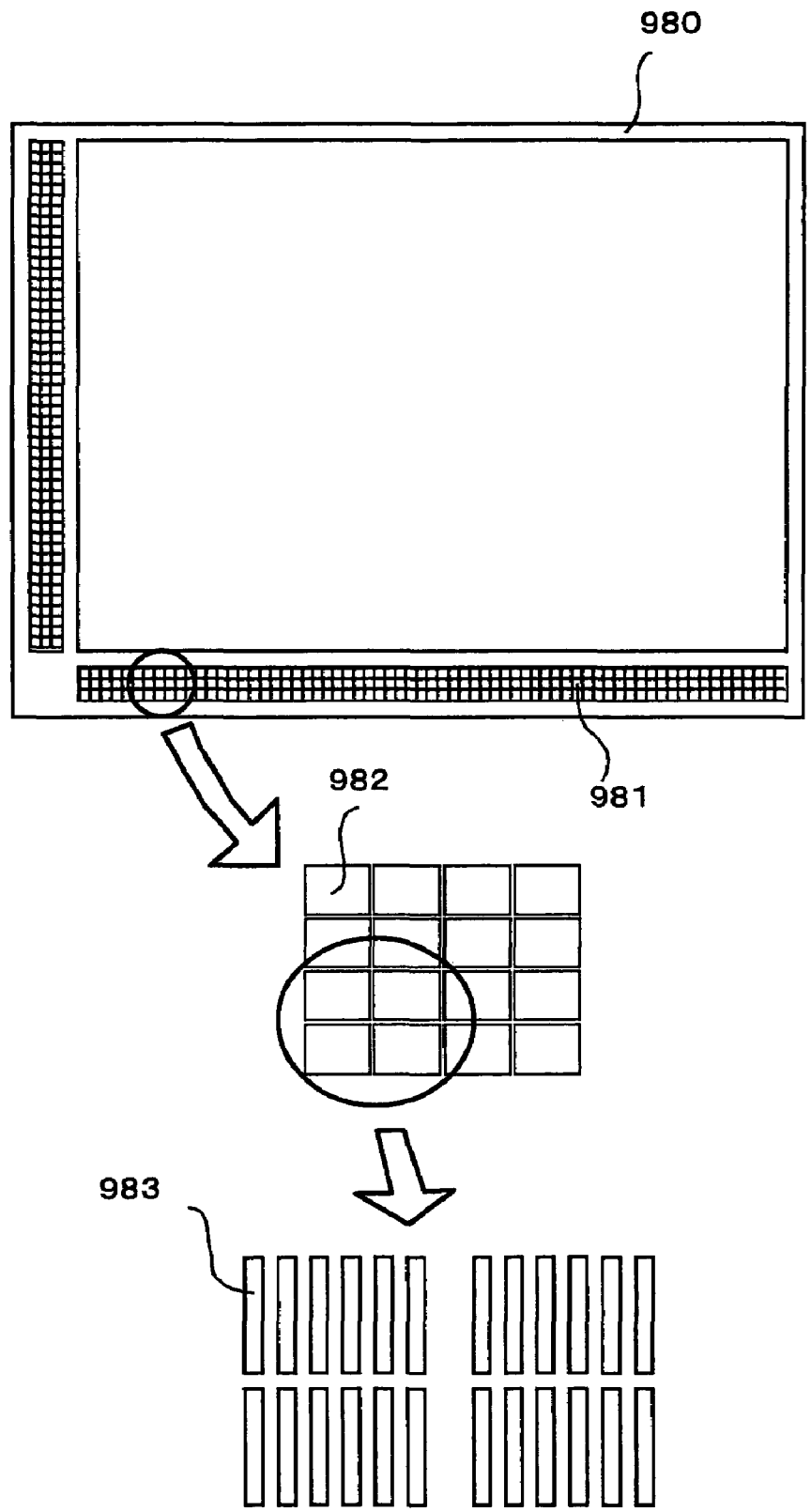
FIG. 35 is a schematic representation showing a relative position among pixel part, peripheral circuit part, and circuit formed in peripheral part of a panel after laser annealing according to the invention

Assuming a case where transistors to be formed are to constitute a driver circuit 981 for signal lines, formed on top of a glass substrate 980, as shown in FIG. 35, thee are formed 6 circuits 983 each for driving 2 pixels at a pitch of 250 µm, more exactly, 2 pixels each comprising 1 dot each of R, G, B, that is, 6 dots, in one pseudo-single crystal region 982 formed at pitches of 500 µm. Generally, in one pseudo-single crystal region, circuits are formed at identical pitches to form a circuit group, and these circuit groups are formed at pitches for forming the pseudo-single crystal regions. That is, these are configured such that, on the glass substrate, the circuits having an identical function for driving respective signal lines are disposed not at an equal interval throughout one panel, but a plurality of the circuit groups having an identical function are disposed at identical pitches.

Assuming a further embodiment where a region 4 mm in width is annealed by scanning with laser beam 500 µm×10 µm by way of example, an annealing width by one scanning is preferably increased as much as possible within a permissible range of laser output, and an annealing length (a size of an annealing region, in the scanning direction) and a pitch of the annealing region are preferably an integral multiple of a pixel pitch, respectively. In this case as well, assuming that a pixel pitch is 250 µm, one annealing region is set to 500 µm×500 µm, and irradiation is executed at pitches of 500 µm.

Figure 32:
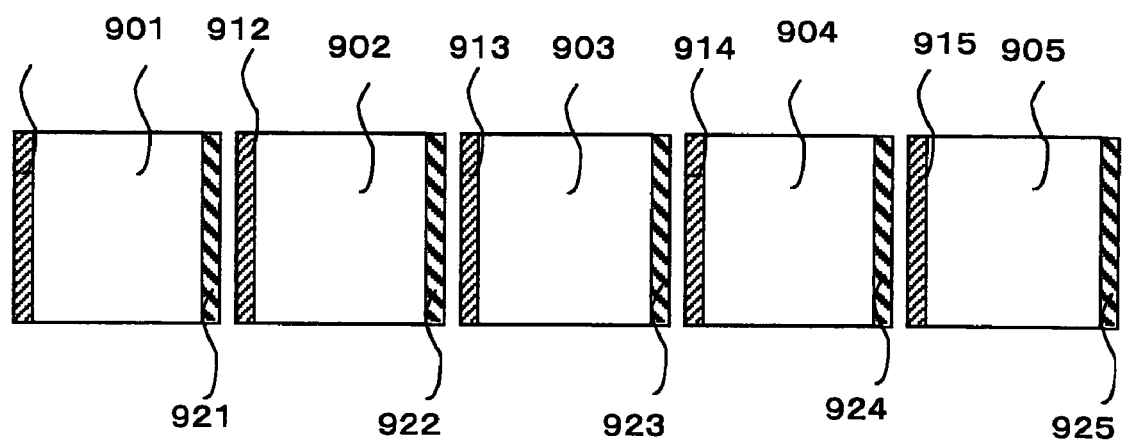
FIG. 32 is a plan view showing a state of annealing region upon completion of a first scanning according to another embodiment of the invention.
Figure 33:
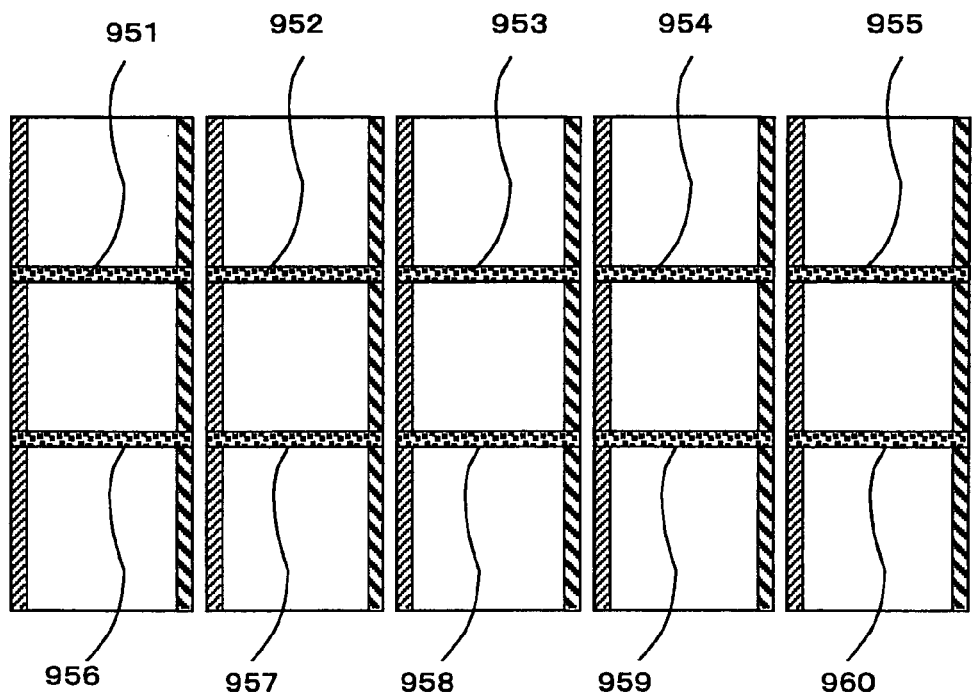
FIG. 33 is a plan view showing a state of annealing region upon completion of a second scanning according to another embodiment of the invention.
Figure 34:
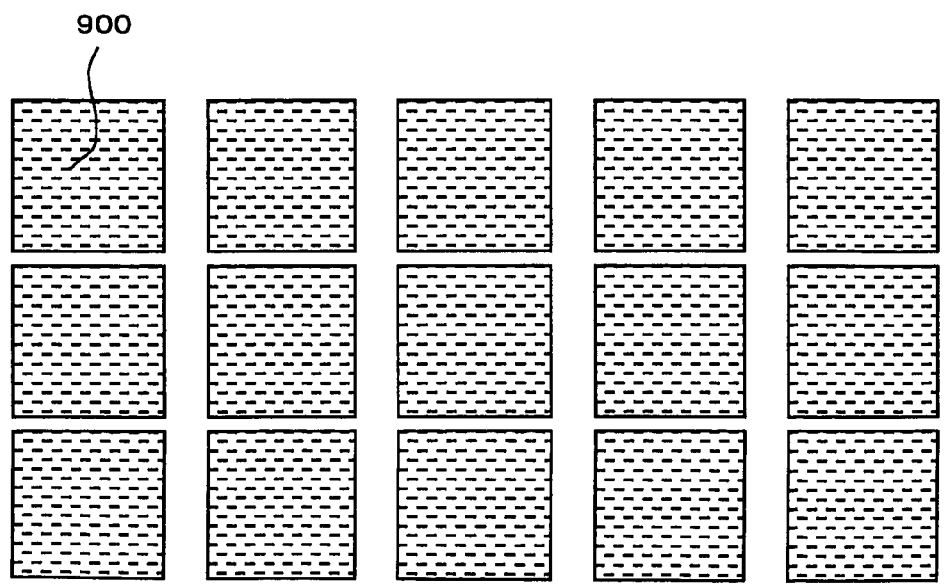
FIG. 34 is a plan view showing a state of annealing region upon completion of annealing according to another embodiment of the invention.

First, regions each 500 µm×490 µm in size are irradiated at pitches of 1 mm by a first scanning as shown in FIG. 32. In this case, the respective regions 500 µm×490 µm are irradiated with laser light, and annealed regions are formed at the pitches of 500 µm. In the respective annealed regions 901, 902, 903, 904, 905, there occurs a decrease of film thickness in regions 911, 912, 913, 914, 915, about 10 µm wide, respectively, of an anneal start part, due to melted silicon being carries away by interfacial tension. In respective regions 921, 922, 923, 924, 925, about 10 µm wide, of an anneal termination part, a swell (protrusion) is formed The respective annealed regions 901, 902, 903, 904, 905, sandwiched between those regions, are well annealed, forming a pseudo-single crystal film, respectively.

Further, with the present embodiment, there is left out a non-irradiated region 10 µm wide between the respective irradiation regions, however, these regions are necessary regions in order to temporarily stop crystal growth taking place up to then to thereby induce new crystal growth, and also, to interrupt buildup of heat in the substrate due to laser irradiation.

Next, similar annealing is executed by shifting 500 µm in the direction normal to the scanning direction, which is repeated until an entire width requiring annealing is annealed. With the present embodiment, a width 4 mm is to be annealed, scanning of 8 rows, that is, scanning is repeated 16 times.

When laser light is irradiated by changing rows, in consequence of such operation, irradiation is duplicated, portions not irradiated are left out, or portions previously irradiated are subjected to thermal effects at the time of a successive irradiation, thereby disturbing crystal morphology, in overlapped parts 951, 952, 953, 954, 955, 956, 957, 958, 959, 960. Accordingly, there are left out the regions about 10 µm wide, unsuitable for formation of transistors.

Having taken those into consideration, it can be said that well annealed regions (that is, pseudo-single crystal regions) each 490 µm×470 µm are finally formed at pitches of 500 µm as shown FIG. 31. In the interests of simplicity, it can be said that pseudo-single crystal silicon films each 490 µm×470 µm are formed at pitches of 500 µm on the glass substrate in such a manner as tiles are stuck thereto. By designing such that a transistor can be disposed on the respective tiles of pseudo-single crystal silicon, high-performance transistors can be formed.

Herein, there has been described a case where annealing is executed by scanning in the same direction, however, irradiation may be carried out by setting such that there is a shift of the irradiation position by 500 µm between scanning in one direction and scanning in the opposite direction in the case of reciprocative scanning. In this case, there will be a change in arrangement of parts with decreased film thickness and parts with a protrusion from row to row, however, since any thereof is about 10 µm in width, and is unsuitable for formation of transistors, pseudo-single crystal regions suitable for formation of transistors will the same as those shown in FIG. 31. In comparison with the previously described embodiment, the respective pseudo-single crystal regions become slightly narrower, however, throughput is increased about twice as much.

Assuming a case where transistors to be formed are to constitute a driver circuit 981 for signal lines, formed on top of a glass substrate 980, as shown in FIG. 35, thee are formed 6 circuits 983 each for driving 2 pixels at a pitch of 250 µm, more exactly, 2 pixels each comprising 1 dot each of R, G, B, that is, 6 dots, in one pseudo-single crystal region 982 formed at pitches of 500 µm. Generally, in one pseudo-single crystal region, circuits are formed at identical pitches to form a circuit group, and these circuit groups are formed at pitches for forming the pseudo-single crystal regions. That is, these are configured such that, on the glass substrate, the circuits having an identical function for driving respective signal lines are disposed not at an equal interval throughout one panel, but a plurality of the circuit groups having an identical function are disposed at identical pitches.

In the foregoing description, there has been described that an annealing width, annealing length, and a pitch regulate respective laser annealing regions, however, respective sizes can be converted into pulse numbers as generated by the linear scales installed in the stage 2. Accordingly, it is evident that timing for ON/OFF of the laser light can be implemented by activating at a point in time when corresponding pulse numbers are counted, respectively. However, detailed description in this connection is omitted herein.

Figure 14:
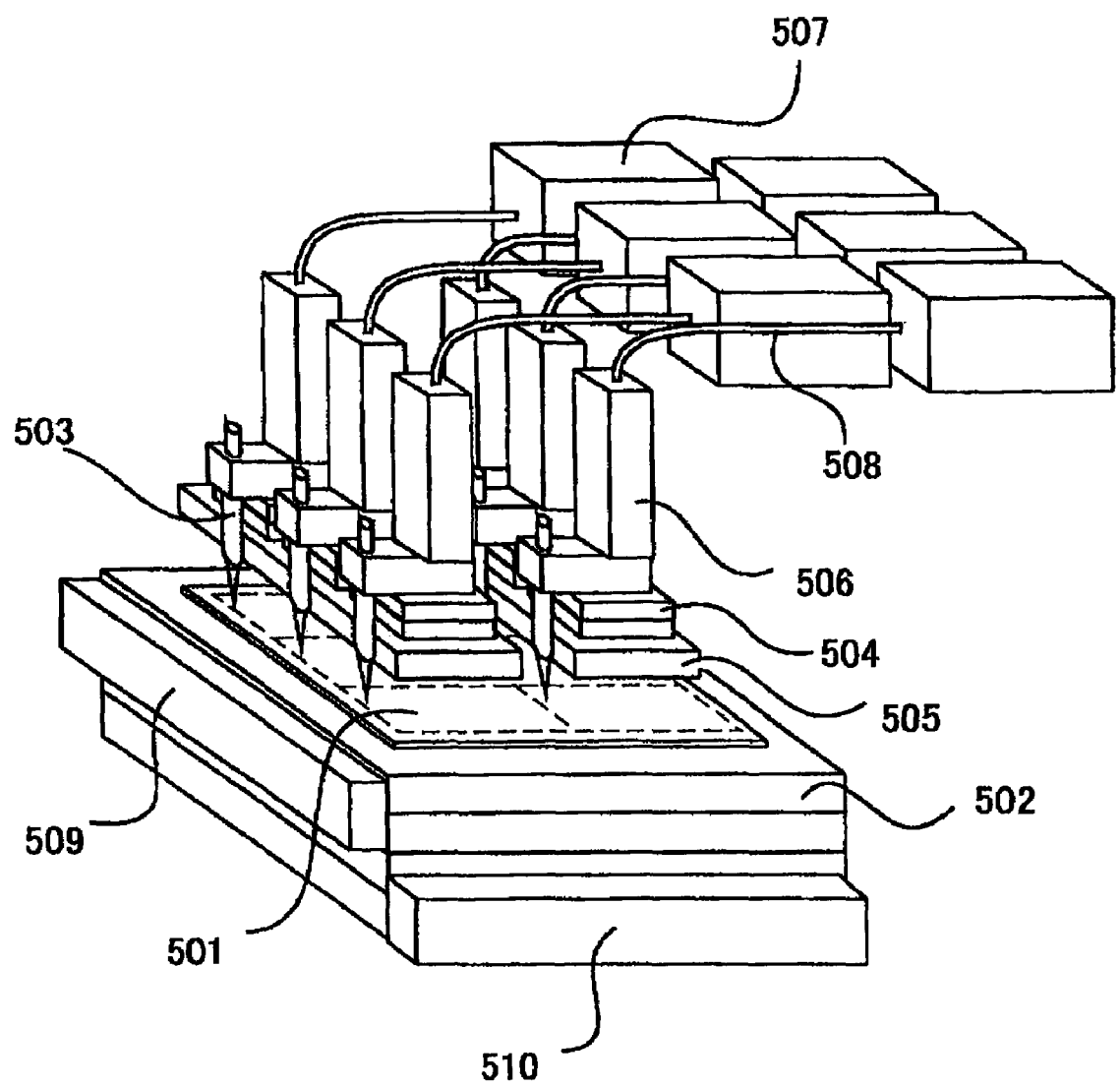
FIG. 14 is a schematic representation for illustrating another embodiment of an apparatus, that is, a laser annealing apparatus for fabricating the display device according to the invention.

FIG. 14 is a schematic representation for illustrating another embodiment of an apparatus, that is, a laser annealing apparatus for fabricating the display device according to the invention. The apparatus according to the present embodiment comprises a stage 502 on which a large sized substrate 502 is placed, a plurality of optical body tubes 503 each provided with a laser irradiation optical system, adjustment stages 504 for independently adjusting the respective positions of the optical body tubes 503, a stand 505 (partly shown in the figure) for holding the adjustment stage 504, continuous-wave oscillators 506, laser diode power sources 507 for pumping the respective continuous-wave oscillators 506, fibers 508 for transmitting pumped light, and linear scales 509, 510, for detecting the position of the stage 502.

Figure 15:
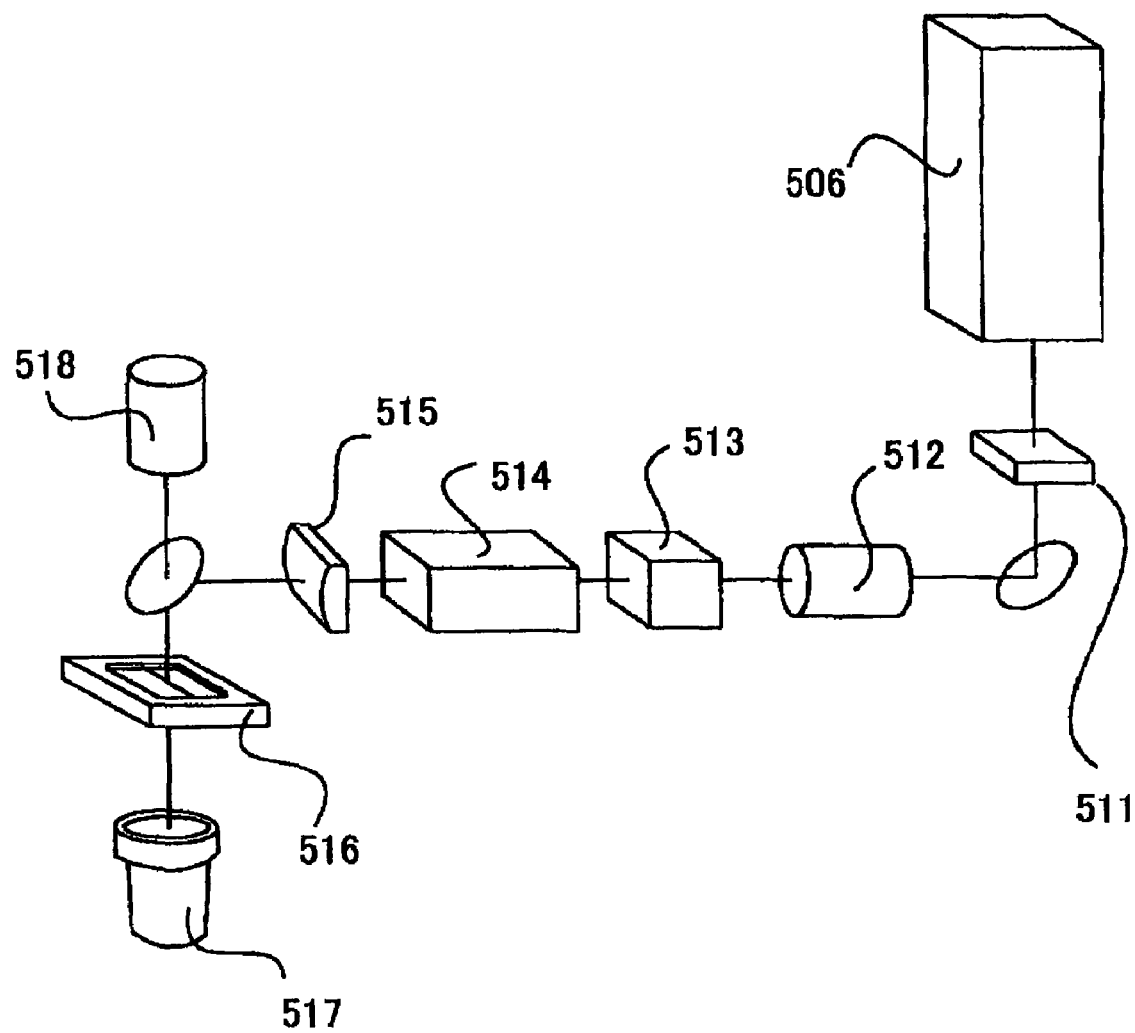
FIG. 15 is a schematic representation for illustrating the optical system in FIG. 14.

FIG. 15 is a schematic representation for illustrating the optical system in FIG. 14. Inside the respective optical body tubes 503 shown in FIG. 14, there is provided the laser irradiation optical system comprising a shutter 511, a beam expander 512, a continuously variable transmittance filter 513, an EO modulator 514, a cylindrical lens 515, a rectangular slit 516, an objective lens 517, a CCD camera 518, and so forth, as shown in FIG. 15. Further, an illuminating light device for observation, a reference light source a monitor for observation, an automatic focusing optical system, an image processing device, a controller, and so forth are omitted in FIG. 15, however, the optical system is basically the same in configuration as that shown in FIG. 1. Further, the respective functions of components are the same as those for the annealing apparatus shown in FIG. 1, and detailed description thereof is omitted herein. The present optical system differs from that in FIG. 1 in that a plurality of (6 in FIG. 14) the laser irradiation optical systems are housed in the individual optical body tubes (represented by 503 in the figure), respectively, and are fixedly attached on the adjustment stages (represented by 504 in the figure) capable of independently moving in the directions of X, Y, and Z, respectively, so that the respective positions of the optical body tubes (represented by 503 in the figure) is adjustable so as to enable laser light to be irradiated to an identical spot on respective panels, thereby enabling laser annealing to be simultaneously applied to a plurality of spots.

Now, there is described a laser annealing method using the laser annealing apparatus described. For a substrate 501, use is made of a polycrystalline silicon thin film substrate 501 obtained by forming an amorphous silicon film on the top surface of a glass substrate 1 shown FIG. 6 through the intermediary of an insulator thin film, and by transforming the amorphous silicon film into a polycrystalline silicon film composed of fine crystal grains after scanning across the amorphous silicon film with excimer laser light. In this case, the insulator thin film is a $SiO_2$, SiN film, or a composite film thereof. A plurality of panels (in FIG. 14, 6 panels on one substrate) is formed on the polycrystalline silicon thin film substrate.

First, the polycrystalline silicon thin film substrate 501 is placed on the stage 502. On the polycrystalline silicon thin film substrate 501, alignment marks (not shown) are formed at plural spots of regions where the respective panels (in FIG. 14, 6 panels) are to be formed. These alignment marks are normally formed by photo-etching techniques, however, use of a photo resist step for this purpose only will result in much wastage. Accordingly, after execution of approximate alignment by detecting the corners of the polycrystalline silicon thin film substrate 501, laser light for use in laser annealing is formed in the shape of, for example, a rectangle longer in the longitudinal direction and a rectangle longer in the transverse direction, respectively, by use of the rectangular slit 516 of the respective optical body tubes 503 to thereby remove portions of the polycrystalline silicon thin film, so that a cross mark is sequentially formed at plural spots of the respective panels, thereby serving as the alignment marks. Or after positioning the respective optical body tubes at a predetermined base position, a cross mark may be simultaneously formed at plural spots of the respective panels, thereby serving as the alignment marks. Otherwise, dot-like alignment marks may be formed by ink-jet means and so forth.

Subsequently, by taking pictures of the alignment marks at two spots with the CCD camera 518 of one of the optical body tubes (for example, 503), and detecting the position of the center of gravity of the respective pictures, the stage 502 is caused to move along three axes of X, Y, Z, respectively, according to design coordinates on the basis of the alignment marks, thereby implementing fine alignment of the polycrystalline silicon thin film substrate 501. In this case, the CCD camera of the optical body tube intended for annealing is used for detection of the alignment marks, but another optical system for alignment may be installed. In such a case, a plurality of the alignment marks may be sequentially detected with one optical system, or a plurality of the alignment marks may be simultaneously detected with a plurality of optical systems.

After completion of alignment of the polycrystalline silicon thin film substrate 501, the stage 502 is moved according to the design coordinates such that the alignment mark at one spot among the alignment marks of the respective panels comes into a field of view of the respective optical body tubes, the pictures of the alignment marks are taken with the CCD camera 518 of the respective optical body tubes, and adjustment is made with the respective adjustment stages 504 such that the center of gravity of the respective pictures coincides with the center of the respective fields of view. By so doing, the position of the respective optical body tubes is adjusted such that an identical spot on the respective panels formed on the polycrystalline silicon thin film substrate 501 is irradiated with laser light.

Thereafter, as previously described, annealing is applied such that only a portion of a driver circuit forming region of the respective panels, where an active layer (active region) is to be formed, is irradiated with laser light in accordance with design data. At this point in time, pulse signals generated by the linear scale 509 or 510, installed in the stage 502, are counted and upon the stage 502 reaching the position for irradiation with laser light, the laser light is turned into ON state by the EO modulator 514, and is condensed into a linear form by the cylindrical lens 515, so that unnecessary portions of the laser light are cut off by the rectangular slit 516 to be thereby condensed by the objective lens 517 before irradiation.

Laser energy is adjusted with the continuously variable transmittance filter 513 as necessary. Further, the signals from the linear scale 509 or 510 are counted and when the stage 502 is shifted and passes through a region to be annealed, the laser light is turned into OFF state by the EO modulator 514, so that only regions requiring annealing can be accurately irradiated with the laser light. Timing for irradiation with the laser light is as preciously described with reference to FIGS. 7 and 13.

Regions to be irradiated with the laser light are, for example, active layer parts of the thin-film transistors making up the driver circuit for driving pixels, and while scanning the polycrystalline silicon thin film substrate 501 by driving the stage 502, only necessary parts are sequentially irradiated. At this point in time, the respective optical body tubes drive the individual adjustment stages 504 with the optical body tube mounted thereon in the Z-direction by the agency of an automatic focusing mechanism (not shown), thereby controlling all the objective lenses so as to be at a given position in relation to the surface of the polycrystalline silicon thin film substrate 501.

If a multitude of small sized panels are arranged on one glass substrate, a procedure is repeated whereby annealing is executed for every several panels, and after shifting the glass substrate by a distance corresponding to a pitch at which the panels are arranged, annealing is again executed, thereby enabling all the panels to be annealed. Changes occurring to crystal grains of the polycrystalline silicon thin film when irradiated with the laser light are as previously described, and since growth of crystal grain occurs in the direction of scanning with the laser light, the polycrystalline silicon thin film can effectively obtain properties equivalent to those of a single crystal by causing the direction of current flow to coincide with the direction of crystal growth when transistors are formed.

Now, a still further embodiment of the invention is described hereinafter. With the embodiment described in the foregoing, it has been described that only regions to be annealed are irradiated with the laser light. More specifically, for a time period from the start of movement of the stage 502 until arrival thereof at an irradiation region, the laser light is kept fully in OFF state and upon the stage 502 reaching the irradiation region, irradiation is started at a predetermined output while upon the stage 502 passing through the irradiation region, the laser light is turned fully in OFF state. By repeating such an operation, laser annealing is applied to a plurality of regions. If the laser light is irradiated by this method, there occurs the following phenomenon.

Figure 20:
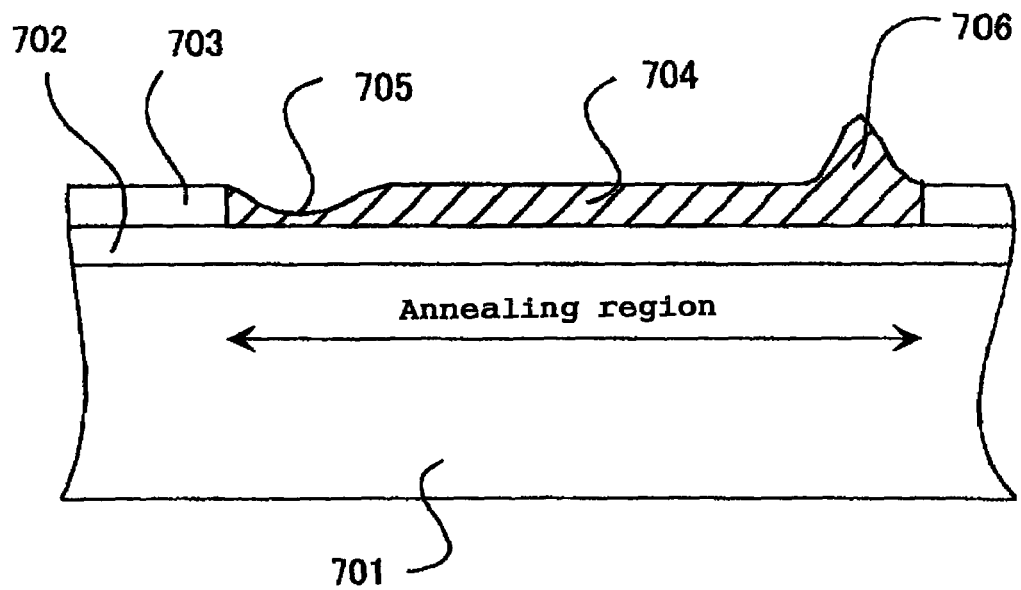
FIG. 20 is a sectional view showing the sectional shape of a thin-film transistor substrate to which a laser annealing method according to the present embodiment is applied.

FIG. 20 is a sectional view showing the sectional shape of a thin-film transistor substrate to which a laser annealing method according to the present embodiment is applied. As shown in FIG. 20, a polycrystalline silicon thin film 703 formed on a glass substrate 701 through the intermediary of an insulator film 702 melts the instant that irradiation of continuous-wave laser is started at a spot of irradiation start, and melted silicon is pulled in a scanning direction by the agency of interfacial tension. Accordingly, upon cooling and solidification of the melted silicon after passing of the laser light, there occurs a portion 705 of the polycrystalline silicon thin film 703, smaller in thickness. In a region following the portion 705 smaller in thickness, a portion 704 thereof, having an original film thickness, is maintained, however, when the continuous-wave laser is turned into OFF state at a spot of irradiation completion, the melted silicon pulled in by the agency of interfacial tension cools down and is solidified on the spot, thereby causing a swell 706 to occur.

Thus, the thickness of the silicon film at the spots irradiation start and irradiation completion differs from that in other parts, and consequently, characteristics of transistors formed at these spots are changed from those in other parts, so that the transistors cannot be disposed at these spots. Accordingly, there has been necessity of giving consideration so as not to allow the portion 705 smaller in thickness and the swell 706 to overlap the active layer of the respective transistors making up the driver circuit. Furthermore, in case the swell 706 at the spot of irradiation completion is large, the swell 706 cannot be completely removed in an etching step for leaving out only the active layer of the respective transistors, causing etching residue to occur. It has since turned out that there is a problem in that overlying electrodes and wiring are broken in the worst case, and reliability deteriorates even if no break occurs thereto. Hence, the following laser irradiation method is adopted.

Figure 21:
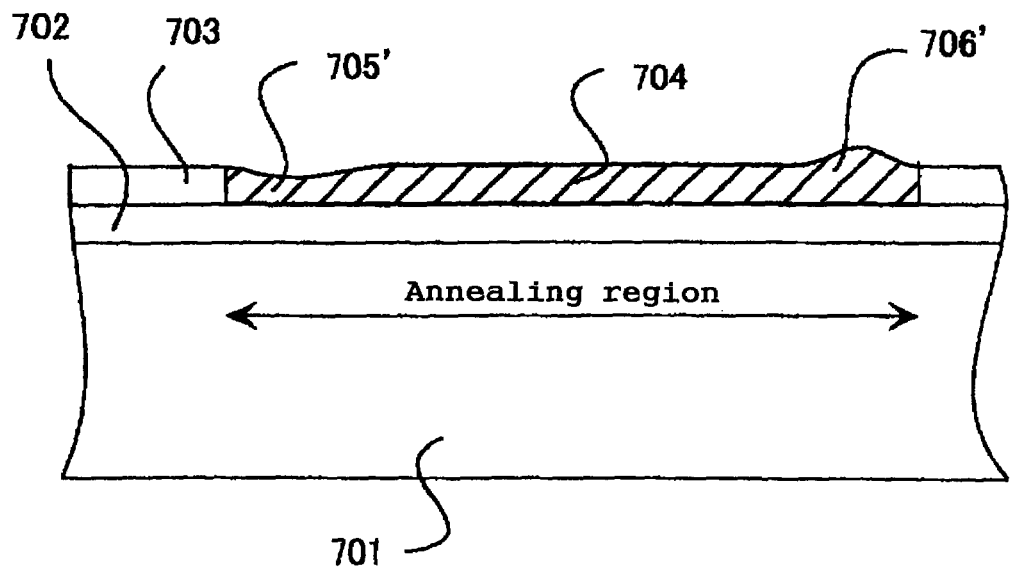
FIG. 21 is a sectional view showing the sectional shape of a thin-film transistor substrate to which the laser annealing method described with reference to FIG. 19A is applied.

FIG. 19 is a schematic representation for illustrating a relationship between a stage position according to another embodiment of the invention and laser output. By changing setting of the EO modulator 10 in FIG. 1, laser light is irradiated at low output in a region where no annealing is applied while the laser light is irradiated at high output in a region where annealing is to be applied as shown in FIG. 19A. Annealing at a power density of the laser light, in a range of $100 \times 10^3$ W/cm$^2$ to $500 \times 10^3$ W/cm$^2$, is suitable, however, in the region where no annealing is applied, irradiation is executed at a power density not more than one third the power density described. FIG. 21 is a sectional view showing the sectional shape of a thin-film transistor substrate to which the laser annealing method described with reference to FIG. 19A is applied.

As shown in FIG. 21, since no annealing is applied to portions of a band-like polycrystalline silicon film 703 formed on a glass substrate 701 through the intermediary of an insulator film 702, in regions where laser light is irradiated at low output, no damage occurs to the substrate, so that an adverse effect of a portion 705' smaller in thickness at a spot of irradiation start and a swell 706' at a spot of irradiation completion, respectively, can be alleviated and in a portion irradiated at output suitable for annealing, growth of crystal grains occurs in a direction of scanning with the laser light, thereby obtaining a band-like polycrystalline silicon film of intended film quality.

Further, as shown in FIG. 19B or 19C, laser output is successively increased predetermined time or a predetermined distance before reaching an annealing region so as to reach output suitable for annealing upon reaching the annealing region, and after passing through the annealing region, the laser output is successively decreased so that at predetermined time or a predetermined distance later, the laser output becomes not more than one third the output suitable for annealing or the laser light is turned into OFF state. As a result, rapid increase in temperature at a spot of irradiation start as well as a spot of irradiation completion can be eased and an adverse effect of a decrease in thickness at the spot of irradiation start and a swell at the spot of irradiation completion, respectively, can be alleviated, so that in a portion irradiated at output suitable for annealing, growth of crystal grains occurs in a direction of scanning with the laser light, thereby obtaining a silicon film of intended film quality.

Figure 24:
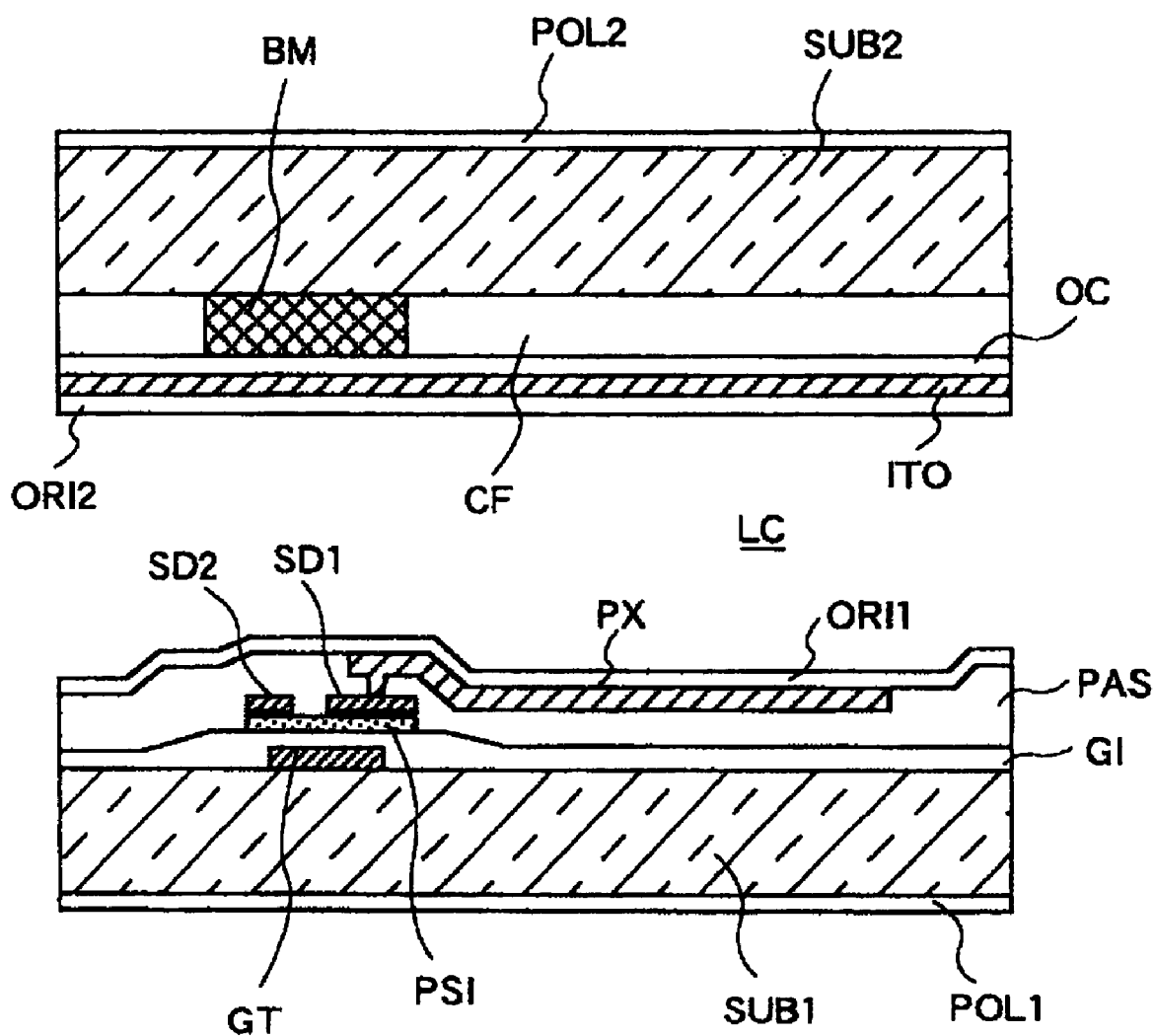
FIG. 24 is a sectional view of the principal part of a liquid crystal display panel of a liquid crystal display device which is an example of an embodiment of a display device according to the invention for illustrating an example of configuration thereof.

FIG. 24 is a sectional view of the principal part of a liquid crystal display panel of a liquid crystal display device which is an example of an embodiment of a display device according to the invention for illustrating an example of configuration thereof. The liquid crystal display panel comprises a first substrate SUB1, a second substrate SUB2, and a liquid crystal layer LC sandwiched in a gap therebetween. The first substrate SUB1 corresponds to the active matrix substrate (thin-film transistor substrate) described with reference to the embodiments in the foregoing. The first substrate SUB1 is a glass substrate, and on the top surface, that is, the inner surface thereof, there are formed a gate electrode GT, an active layer (semiconductor film) PS1 made up of a band-like polycrystalline silicon film, a source electrode SD1, a drain electrode SD2. And a pixel electrode PX connected to the source electrode SD1. Further, reference numerals G1, PASD (one layer or multiplayer) denote insulating layers, OR11 denotes an alignment layer, and POLL a polarizer. On the periphery of the first substrate SUB1, there is formed a driving circuit (driver circuit) described with reference to FIG. 6 or 18.

Meanwhile, the second substrate SUB2 too is a glass substrate, and on the top surface (inner surface) thereof, there are formed a color filter CF partitioned with a black matrix BM, an overcoat layer OC, a common electrode (opposite electrode) ITO and an alignment layer OR12. Further, reference numeral POL2 denotes a polarizer. An electric field in a direction normal to the surface of the substrate is formed between the pixel electrode PX and the common electrode ITO, and the electric field controls the direction of the alignment of molecules of liquid crystal composition making up the liquid crystal layer in such a way as to allow light falling on the first substrate SUB1 to go out of the second substrate SUB2 or to block the light, thereby displaying images.

FIG. 25 is a sectional view of the principal part of a liquid crystal display panel of a liquid crystal display device which is an example of an embodiment of a display device according to the invention for illustrating another example of configuration thereof. The liquid crystal display panel comprises a first substrate SUB1, a second substrate SUB2, and a liquid crystal layer LC sandwiched in a clearance therebetween. The first substrate SUB1 corresponds to the active matrix substrate (thin-film transistor substrate) described with reference to the embodiments in the foregoing. The first substrate SUB1 is a glass substrate, and on the top surface, that is, the inner surface thereof, there are formed a gate electrode GT, an active layer (semiconductor film) PS1 made up of a band-like polycrystalline silicon film, a source electrode SD1, a drain electrode SD2. And pixel electrodes PX connected to the source electrode SD1, arranged in a manner like the teeth of a comb in a pixel region.

Opposite electrodes CT are interposed between the pixel electrodes PX arranged in the manner like the teeth of the comb.

Further, reference numerals G1, PASD (one layer or multiplayer) denote insulating layers, OR11 denotes an alignment layer, and POLL a polarizer. On the periphery of the first substrate SUB1, there is formed a driving circuit (driver circuit) described with reference to FIG. 6 or 18.

Meanwhile, the second substrate SUB2 too is a glass substrate, and on the top surface (inner surface) thereof, there are formed a color filter CF partitioned with a black matrix BM, an overcoat layer OC, and an alignment layer OR12. Further, reference numeral POL2 denotes a polarizer. An electric field in a direction normal to the surface of the substrate is formed between the pixel electrode PX and the common electrode ITO, and the electric field controls the direction of the alignment of molecules of liquid crystal composition making up the liquid crystal layer in such a way as to allow light falling on the first substrate SUB1 to go out of the second substrate SUB2 or to block the light, thereby displaying images.

Figure 26:
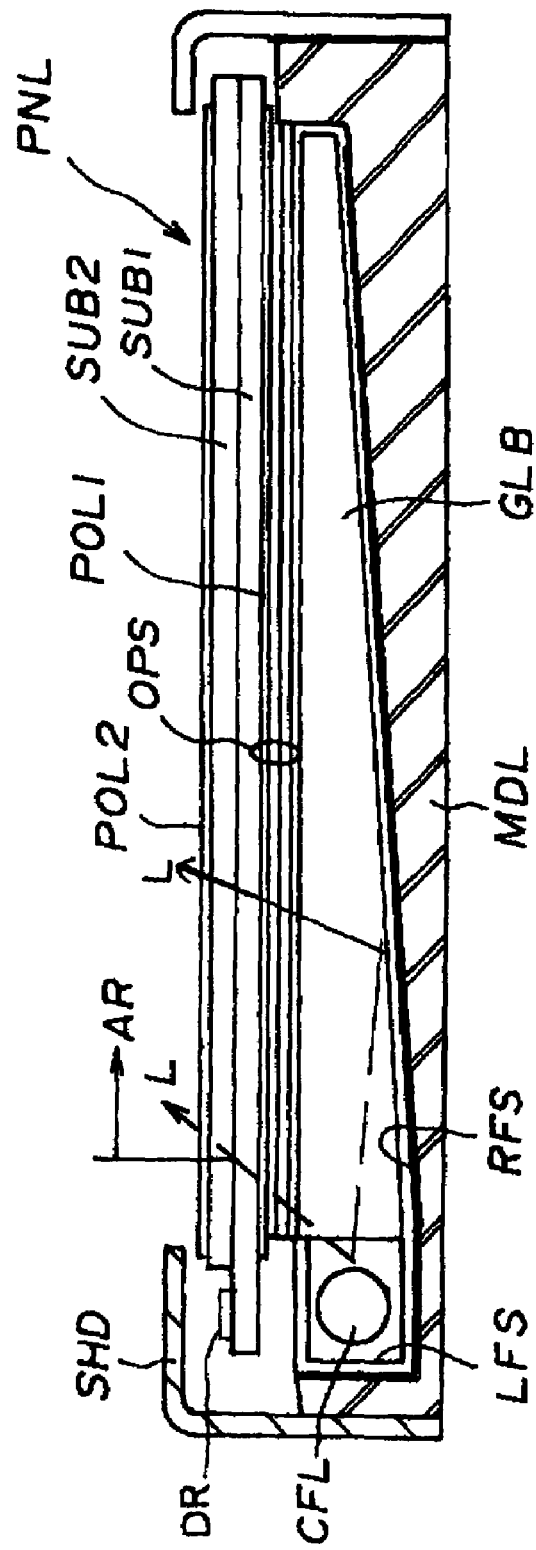
FIG. 26 is a sectional view for illustrating a schematic configuration of a liquid crystal display device using the liquid crystal display panel described with reference to FIGS. 24, and 25.

FIG. 26 is a sectional view for illustrating a schematic configuration of a liquid crystal display device using the liquid crystal display panel described with reference to FIGS. 24, and 25.

With the liquid crystal display device (liquid crystal display module), a backlight is installed on the backside of a liquid crystal display panel PNL through the intermediary of an optical compensatory sheet OPS made up of a diffusion sheet laminated to a prism sheet, and a shield case SHD, which is an upper case, is formed integrally with a mold case MDL, which is a lower case. On the periphery of a first substrate SUB1 of the liquid crystal panel PNL, there is formed the driving circuit (driver circuit) as described above.

The backlight shown in FIG. 26 is a so-called side lamp type comprising a light source (herein, a cold cathode fluorescent lamp CFL) disposed on the side edge of an guide light board GLB suitably made up of an acrylic plate, a reflective sheet RFS, a lamp reflection sheet LFS, and so forth. However, as a backlight other than the type as above, there are known a so-called directly underside type backlight wherein a plurality of light sources are disposed directly under the backside of a liquid crystal display panel, or a so-called front-light type disposed in the vicinity of the surface (visible side) of a liquid crystal display panel, and so on.

Figure 27:
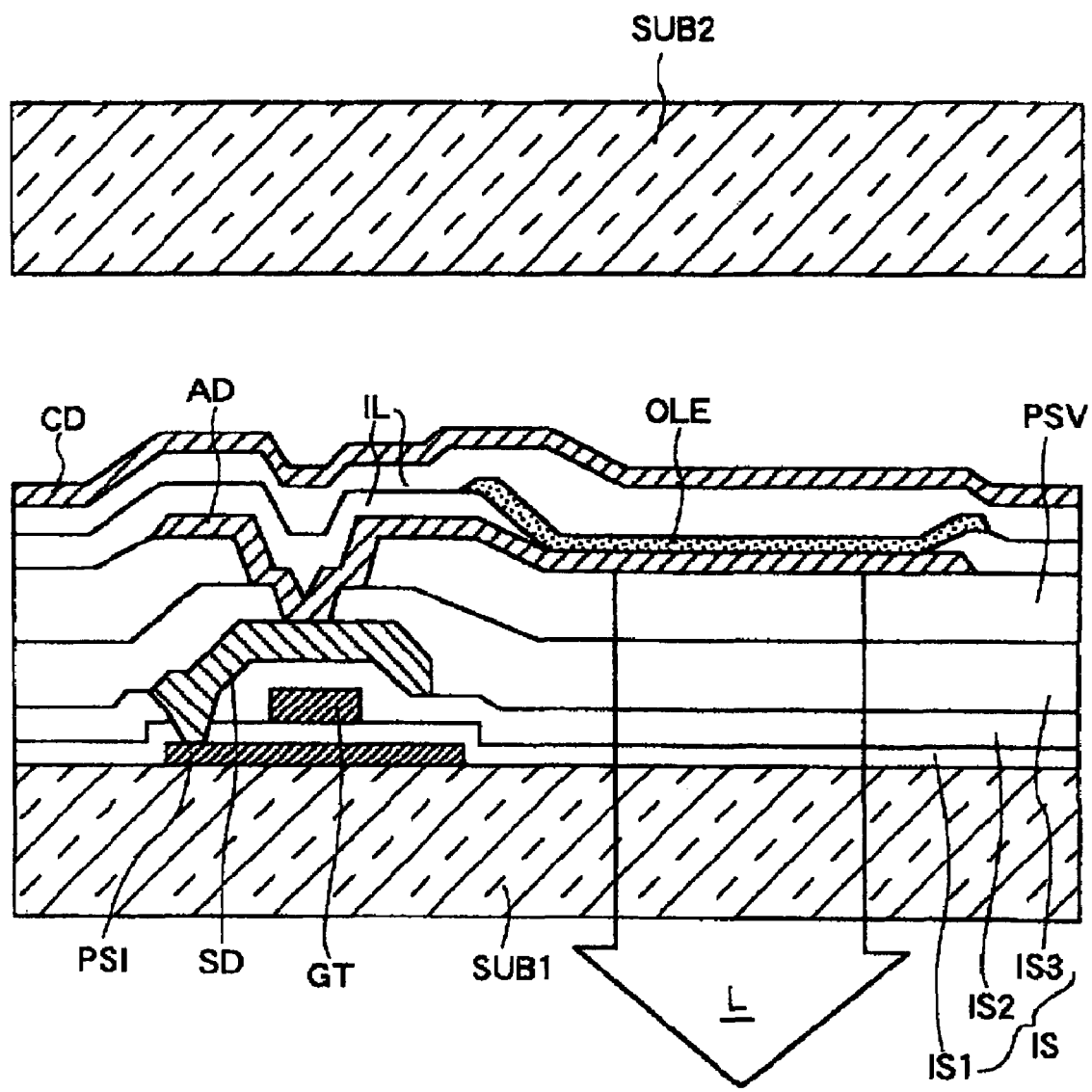
FIG. 27 is a sectional view of the principal part of a display panel making up an organic electro-luminescent display panel, another example of the display device according to the invention, for illustrating a schematic configuration thereof.

FIG. 27 is a sectional view of the principal part of a display panel making up an organic electro-luminescent display panel, another example of the display device according to the invention, for illustrating a schematic configuration thereof. The organic electro-luminescent display panel (abbreviated organic EL) comprises a first substrate SUB1, and a second substrate SUB2, but the second substrate SUB2 is a sealing case for protecting various function films of the first substrate SUB1, as described hereinafter, from environments, and is made up of not only a glass substrate but also a metal sheet at times. The first substrate SUB1 corresponds to the active matrix substrate (thin-film transistor substrate) described with reference to various embodiments in the foregoing. The first substrate SUB1 is a glass substrate, and on the top surface, that is, inner surface thereof, there are provided thin-film transistors made of the band-like polycrystalline silicon film as reformed by the previously described method.

Respective pixel circuits of the organic EL panel have at least the thin-film transistors for switching and the thin-film transistors for driving, and the thin-film transistors shown in the figure correspond to the thin-film transistors for driving, the thin-film transistors for switching being omitted in the figure. The thin-film transistor comprises a band-like polycrystalline silicon film PS1, a gate electrode GT, and a source electrode SD. Further, it comprises an anode AD connected to the source electrode SD, a luminescent layer OLE, and a cathode CD. Reference numerals IS (IS1, IS2, IS3), PSV, IL denote an insulating layer, respectively. There is a case where a desiccant is provide on the inner surface of the second substrate SUB2. Further, dispositions of the anode AD and cathode CD are not necessarily limited to those shown in the figure, and respective polarities may be changed over.

With this configuration, current flows between the anode AD and cathode CD by selection of the thin-film transistors for driving, whereupon the luminescent layer OLE, interposed between the anode AD and cathode CD, emits light. The emitted light outgoes from the side of the first substrate SUB1. There is another type wherein reflective metal is used for the anode AD, and a transparent electrode is used for the cathode CD, thereby sending out the emitted light from the side of the second substrate SUB2 In such a case, a transparent sheet such as a glass sheet is used for the second substrate SUB2 (sealing case). The organic EL panel is housed in an appropriate case or frame to be used as an organic EL display device (module).

It is to be pointed out that the invention is not limited to those configurations as described hereinbefore, and that various changes and modifications may be made in the invention without departing from the spirit and scope thereof. Further, it is obvious that the invention is similarly applicable to a substrate for various electronic equipment wherein active elements such as thin-film transistors are formed on an insulating substrate.

As described hereinbefore, with the process (laser annealing method) of fabricating the display device according to the invention and the apparatus (laser annealing apparatus) for fabricating the same, laser light can be accurately irradiated to a spot to be irradiated (annealed) without variation in stage speed while preventing adverse effects on the insulating substrate such as a glass substrate. Further, since the stage moves at a constant speed, annealing can be executed under a constant condition regardless of the position of a spot on the substrate.

As a result, by causing growth of crystal grains of the amorphous or polycrystalline silicon thin film to take place in a desired direction, these can be reformed into the band-like polycrystalline silicon film composed of large crystal grains in excess of 10 µm in grain size, so that mobility of the active elements such as the thin-film transistors, made of the band-like polycrystalline silicon film, can be drastically improved.

The active elements such as the thin-film transistors, formed of a silicon film reformed by the process of the invention, have performance sufficient for making up the driver circuit in a display device such as a liquid crystal display device, an organic EL display, so that a system on panel can be implemented, and various display devices for a liquid crystal display device intended for reduction in size and cost.

While we have shown and described several embodiments in accordance with our invention, it should be understood that disclosed embodiments are susceptible of changes and modifications without departing from the scope of the invention. Therefore, we do not intend to be bound by the details shown and described herein but to intend to cover all such changes and modifications as fall within the ambit of the appended claims.

We claim:

1. A process of fabricating a display device for obtaining an active matrix substrate for use in a display device by placing an insulating substrate with an amorphous semiconductor film or a granular polycrystalline semiconductor film formed on the top surface thereof on a stage, irradiating laser light to a plurality of regions on the amorphous semiconductor film or the granular polycrystalline semiconductor film on the insulating substrate so as to be annealed, reforming the amorphous semiconductor film or the granular polycrystalline semiconductor film into polycrystalline semiconductor film containing band shape crystal grains, said process comprising the steps of:

using continuous-wave laser light condensed into linear or rectangular form as the laser light;

continuously shifting the insulating substrate in a shifting direction transverse to the longitudinal direction of the linear form or the rectangular form of the laser light;

detecting a location of the insulating substrate relative to an irradiation position of the laser light for every shift of the insulating substrate of a predetermined distance in the shifting direction; and repeating an operation of starting irradiation of the continuous-wave laser light at a time when respective regions of the insulating substrate to be irradiated with the laser light reach the irradiation position of the laser light, and then stopping irradiation of the continuous-wave laser light at a time when the respective regions of the insulating substrate to be irradiated with the laser light pass the irradiation position of the laser light;

wherein a repeating operation of starting and stopping irradiation of the continuous-wave laser light is effected in accordance with the detection of the location of the insulating substrate; and thereby discontinuously forming the band shape crystal grains of the polycrystalline semiconductor film as reformed in relation to the shifting direction of the insulating substrate.

2. A process of fabricating a display device according to claim 1, further comprising the step of starting irradiation of the continuous-wave laser light upon start of shifting of the insulating substrate at irradiation energy density equivalent to not more than one third of a value suitable for reformation of the amorphous semiconductor film or the granular polycrystalline semiconductor film, setting the irradiation energy density of the continuous-wave laser light at the value suitable for reformation of the amorphous semiconductor film or the granular polycrystalline semiconductor film at a time when respective regions where the reformation is to be made in a state of continuously shifting insulating substrate, and reducing the irradiation energy density of the continuous-wave laser light to not more than one third of a value suitable for reformation of the amorphous semiconductor film or the granular polycrystalline semiconductor film at a time when respective regions where the reformation is to be made is passed.

3. A process of fabricating a display device according to claim 1, where the respective regions where the reformation is to be made are active regions of thin-film transistors, and the periphery thereof.

4. A process of fabricating a display device according to claim 3, where the insulating substrate is a glass substrate and the respective regions where the reformation is to be made are regions where active regions of driver thin-film transistors are formed.

5. A process of fabricating a display device according to claim 1, where the continuous-wave laser light is the second harmonics of LD (laser diode) pumped $YVO_4$ continuous wave laser.

6. A process of fabricating a display device for obtaining an active matrix substrate for use in a, display device by placing an insulating substrate with an amorphous semiconductor film or a granular polycrystalline semiconductor film formed on the top surface thereof on a stage, irradiating laser light to a plurality of regions on the amorphous semiconductor film or the granular polycrystalline semiconductor film on the insulating substrate so as to be annealed, reforming the amorphous semiconductor film or the granular polycrystailine semiconductor film into polycrystalline semiconductor film containing band shape crystal grains, said process comprising the steps of:

using continuous-wave laser light condensed into linear or rectangular form as the laser light;

continuously moving the insulating substrate in a direction crossing the linear form or the longitudinal direction of the rectangular form;

detecting a location of the insulating substrate relative to an irradiation position of the laser light for every movement of the insulating substrate of a predetermined distance in the moving direction; and repeating operation of starting irradiation of the continuous-wave laser light at a time when respective regions of the insulating substrate to be irradiated with the laser light are reached and stopping irradiation of the continuous-wave laser light at a time when the respective regions of the insulating substrate to be irradiated with the laser light are passed, thereby forming the band shape crystal grains of the polycrystalline semiconductor film as reformed at given pitches to an equal size in relation to a moving direction of the insulating substrate.

* * * * *